(12) United States Patent
Yamaji

(10) Patent No.: US 8,704,328 B2
(45) Date of Patent: Apr. 22, 2014

(54) HIGH-VOLTAGE INTEGRATED CIRCUIT DEVICE

(75) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 16 days.

(21) Appl. No.: 13/515,546

(22) PCT Filed: Sep. 12, 2011

(86) PCT No.: PCT/JP2011/070760
§ 371 (c)(1),
(2), (4) Date: Sep. 24, 2012

(87) PCT Pub. No.: WO2012/176347
PCT Pub. Date: Dec. 27, 2012

(65) Prior Publication Data
US 2013/0001736 A1  Jan. 3, 2013

(30) Foreign Application Priority Data

Jun. 24, 2011 (JP) .................................. 2011-140137

(51) Int. Cl.
*H01L 23/48* (2006.01)

(52) U.S. Cl.
USPC ............ 257/499; 257/360; 257/500; 257/329; 257/328; 257/E29.255; 257/E27.011; 257/E21.41; 257/E29.027; 257/E29.121; 361/56

(58) Field of Classification Search
USPC ......... 257/139, 339, 256, 133, 360, 500, 329, 257/328, E29.255, E27.011, E21.41, 257/E29.027, E29.121, E29.262; 361/56
See application file for complete search history.

(56) References Cited

U.S. PATENT DOCUMENTS

| 6,597,550 | B1 | 7/2003 | Chey et al. | |
|---|---|---|---|---|
| 7,800,167 | B2 * | 9/2010 | Kitamura et al. | ............. 257/329 |
| 2005/0179081 | A1 | 8/2005 | Kitamura et al. | |
| 2008/0029814 | A1 * | 2/2008 | Khalil | ............. 257/339 |
| 2008/0179663 | A1 | 7/2008 | Terashima | |
| 2009/0085117 | A1 | 4/2009 | Harada et al. | |

(Continued)

FOREIGN PATENT DOCUMENTS

| JP | 11-243152 A | 9/1999 |
|---|---|---|
| JP | 2001-025235 A | 1/2001 |

(Continued)

*Primary Examiner* — Jerome Jackson, Jr.
*Assistant Examiner* — Bo Fan
(74) *Attorney, Agent, or Firm* — Rossi, Kimms & McDowell, LLP

(57) ABSTRACT

A high-voltage integrated circuit device has formed therein a high-voltage junction terminating region that is configured by a breakdown voltage region formed of an n-well region, a ground potential region formed of a p-region, a first contact region and a second contact region. An opposition section of the high-voltage junction terminating region, whose distance to an intermediate-potential region formed of a p-drain region is shorter than those of other sections, is provided with a resistance higher than those of the other sections. Accordingly, a cathode resistance of a parasitic diode formed of the p-region and the n-well region increases, locally reducing the amount of electron holes injected at the time of the input of a negative-voltage surge. As a result, an erroneous operation or destruction of a logic part of a high-side circuit can be prevented when the negative-voltage surge is applied to an H-VDD terminal or a Vs terminal.

12 Claims, 17 Drawing Sheets

(56) References Cited

U.S. PATENT DOCUMENTS

| | | | |
|---|---|---|---|
| 2009/0194785 A1* | 8/2009 | Lu et al. | 257/139 |
| 2009/0284882 A1* | 11/2009 | Nakamura | 361/56 |
| 2010/0283116 A1 | 11/2010 | Shimizu | |
| 2011/0140179 A1* | 6/2011 | Kusunoki et al. | 257/256 |
| 2011/0204413 A1* | 8/2011 | Arai et al. | 257/133 |

FOREIGN PATENT DOCUMENTS

| | | |
|---|---|---|
| JP | 3346763 B2 | 9/2002 |
| JP | 2004-274039 A | 9/2004 |
| JP | 2008-186921 A | 8/2008 |
| JP | 2008-301160 A | 12/2008 |
| JP | 2010-263116 A | 11/2010 |

\* cited by examiner

111···SEMICONDUCTOR DEVICE(HVIC)
112···POWER SUPPLY (LOW SIDE)
113···POWER SUPPLY (HIGH SIDE)
114···IGBT (LOW SIDE)
115···IGBT (HIGH SIDE)
116···FWD (LOW SIDE)
117···FWD (HIGH SIDE)
118···LOAD (L LOAD)
119···DETECTION SIGNAL PATH

43···p-CHANNEL MOSFET
72···LEVEL SHIFT RESISTOR
76···DIODE
102···OUTPUT PART

HIGH-VOLTAGE INTEGRATED CIRCUIT DEVICE

CROSS-REFERENCE TO RELATED APPLICATIONS

This application is a National stage application of, and claims priority from, PCT Application No. PCT/JP2011/070760 filed on Sep. 12, 2011.

TECHNICAL FIELD

The present invention relates to a high-voltage integrated circuit device (HVIC) that is used, for example, in transmitting an on/off drive signal to a gate of a switching power device of a PWM inverter, a switching power supply, and the like. The present invention particularly relates to a high-voltage integrated circuit device capable of preventing the occurrence of an erroneous operation caused due to an overcurrent that flows when a negative-voltage surge is input to the circuit.

BACKGROUND ART

An HVIC of an element separation type that utilizes high-voltage junction is used as means for driving a switching power device that configures an upper arm of a power reverse conversion (AC-DC conversion) bridge circuit of a PWM inverter or the like. The HVIC can accomplish high functionality by detecting an overcurrent when the switching power device malfunctions and having temperature detecting means, and can achieve reductions of the size of a power supply system and lowering the costs by not performing potential insulation using a transformer or a photo coupler.

FIG. 9 is an explanatory diagram illustrating an example of connection between a switching power device of a power conversion device such as an inverter and a conventional HVIC that drives the switching power device. FIG. 9 shows an example of a half bridge in which two switching power devices (IGBT 114, 115) are connected to each other in series. The power conversion device shown in FIG. 9 alternately outputs a high potential or a low potential from a Vs terminal, which is an output terminal, by alternately turning the upper arm IGBT 115 and the lower arm IGBT 114 on, to supply an AC power to an L load 118 (run an AC current).

In other words, when outputting a high potential, the IGBT 114 and the IGBT 115 are operated in a manner that the upper arm IGBT 115 is turned on and the lower arm IGBT 114 is turned off. When outputting a low potential, on the other hand, the IGBT 114 and the IGBT 115 are operated in a manner that the upper arm IGBT 115 is turned off and the lower arm IGBT 114 is turned on. Note that FWDs (Free Wheel Diodes) 116, 117 are connected in inverse-parallel to the IGBT 114, 115. Meanwhile, in an HVIC 111, which is a drive element, a gate signal is output to the lower arm IGBT 114 with reference to GND, and a gate signal is output to the upper arm IGBT 115 with reference to the Vs terminal. For this reason, the HVIC 111 needs to be provided with a level shift function.

It should be noted that referential mark Vss in FIG. 9 represents a high-potential side of a high-voltage power supply, which is a main circuit power supply. Referential mark GND represents a ground (earth ground). Referential mark Vs represents an intermediate potential that fluctuates between the Vss potential and a GND potential. Referential mark H-VDD represents a high-potential side of a Vs-based second low-voltage power supply. Referential mark L-VDD represents a high-potential side of a GND-based first low-voltage power supply. In a bootstrap diode (a diode 75 shown in FIG. 2) circuit, the second low-voltage power supply is created from the first low-voltage power supply (L-VDD). Reference numeral 113 represents a high-side power supply and 112 a low-side power supply.

Furthermore, referential mark H-IN represents an input signal/input terminal that is input to a gate of a low-side C-MOS circuit, which is connected to a level-up circuit. Referential mark L-IN represents an input signal/input terminal that is input to a gate of the low-side C-MOS circuit, which is connected to a gate of the lower arm IGBT 114. Referential mark H-OUT represents an output signal/output terminal of a high-side C-MOS circuit, the output signal/output terminal being output to a gate of the upper arm IGBT 115. Referential mark L-OUT is an output signal/output terminal that is output to the gate of the lower arm IGBT 114. Referential mark ALM-IN represents an input signal/input terminal of a detection signal 119 that is obtained when the temperature of the upper arm IGBT 115 or an overcurrent is detected. Referential mark ALM-OUT represents an output signal/output terminal of a level-downed detection signal.

FIGS. 10 and 11 are each a circuit diagram showing a level shift circuit inside the HVIC 111 shown in FIG. 9, and a peripheral circuit of this level shift circuit. FIG. 10 is a circuit diagram that includes a level-up circuit. FIG. 11 is a circuit diagram that includes a level-down circuit. In FIGS. 10 and 11, reference numeral 120 represents a terminal on the high-potential side of the Vs-based second low-voltage power supply.

In the following description, "p" means p-type and "n" means n-type. Here, the low-side C-MOS circuit that transmits an input signal of the level shift circuit and the high-side C-MOS circuit that transmits an output signal of the level shift circuit to the upper arm IGBT 115 are shown as the peripheral circuits.

As shown in FIG. 10, when the input signal (H-IN) of the low-side circuit is input, this signal is input to a gate of an n-channel MOSFET 41 of the level-up circuit via the C-MOS circuit of the low-side circuit. The n-channel MOSFET 41 is turned on/off by this signal, and an output signal of the level-up circuit is output from an output part 101. The C-MOS circuit of the high-side circuit is turned on/off by this signal, and the output signal (H-OUT) is output. This output signal is converted into a Vs-based signal. This output signal is input to the gate of the upper arm IGBT 115, turning the upper arm IGBT 115 on/off. The level-up circuit shown in FIG. 10 is required when the upper arm IGBT 115 is of an n-channel type.

As shown in FIG. 11, the level-down circuit is formed of a p-channel MOSFET 43 and a level shift resistor 72. A diode 76 is connected in parallel to the level shift resistor. A signal of the ALM-IN is input to a gate of the C-MOS circuit of the high-side circuit, and an output signal of the C-MOS circuit is input to a gate of the p-channel MOSFET 43 of the level-down circuit. By turning on/off the p-channel MOSFET 43 with this signal, a low-side signal is output from an output part 102 of the level-down circuit, and a signal that is leveled down from the output side of the C-MOS circuit of the low-side circuit is output from the ALM-OUT to the low side, in the form of a detection signal.

The switching power device is widely used in many fields, including motor control inverters, large-volume PDPs (plasma display panels), power supplies for liquid crystal panels, and inverters for home electronics such as air conditioners and lights.

These motors and lights become inductance loads shown in FIG. 9. Therefore, the Vs terminal or the H-VDD terminal of the HVIC are affected by parasitic inductance components from wires on a printed board or cables extending to the loads. Due to the parasitic inductance components, the Vs terminal or the H-VDD terminal of the HVIC 111 are displaced to a negative-potential side in relation to the ground (the GND terminal shown in FIG. 9) upon switching where the upper arm IGBT 115 is turned off or the lower arm IGBT 114 is turned on. This displacement is a cause of an erroneous operation or a latchup of the high-side circuit, destroying the elements.

FIG. 12 is a detail diagram of a level shift circuit diagram of the conventional HVIC. FIG. 12(a) is a level-up circuit diagram, and FIG. 12(b) is a level-down circuit diagram. The level-up circuit shown in FIG. 12(a) has a level shift resistor 71, and the n-channel MOSFET 41 to which the level shift resistor 71 and a drain are connected, wherein the connection between the level shift resistor 71 and the n-channel MOSFET 41 is configured as the output part 101 of the level-up circuit.

As described above, the diode 75 is connected in parallel to the level shift resistor 71 in order to prevent the level shift resistor 71 from being destroyed when the potential of the H-VDD becomes significantly lower than the GND potential (when an excessive negative-voltage surge is applied). When an overvoltage is applied to the H-VDD, the diode 75 functions to prevent the application of an excessive voltage to the gate of the MOSFET of the C-MOS circuit of the high-side circuit. Normally, a zener diode is frequently used as the diode 75. Furthermore, a body diode 42 is embedded inverse-parallel in the n-channel MOSFET 41.

The level-down circuit shown in FIG. 12(b), on the other hand, has a drain of the p-channel MOSFET 43 and the level shift resistor 72 connected to this drain, wherein the connection between the level shift resistor 72 and the p-channel MOSFET 43 is configured as the output part 102 of the level-down circuit.

The diode 76 is connected in parallel to the level shift resistor 72 in order to prevent the level shift resistor 72 from being destroyed when the potential of the H-VDD becomes significantly lower than the GND potential. Furthermore, when an overvoltage is applied to the H-VDD during an ON operation of the p-channel MOSFET 43, the diode 76 functions to prevent the application of an overvoltage to the gate of the MOSFET of the C-MOS circuit of the low-side circuit. Moreover, a body diode 44 is connected in inverse-parallel to the p-channel MOSFET 43.

FIG. 13 is a cross-sectional diagram showing substantial parts of a logic part, a level-up circuit part, and a high-voltage junction terminating region (HVJT) of each of high-side and low-side circuits of a conventional self-separation type high-voltage integrated circuit device 500. Note that referential marks a to j shown in FIG. 13 represent electrodes formed on each of the regions. Reference numeral 21 represents a p-offset region. Reference numerals 22 to 24, 26 to 28, 32 to 34, and 36 to 38 represent source, drain and contact regions. Reference numerals 25, 29, 35 and 39 represent gate electrodes.

As shown in FIG. 13, an n-well region 2 and n-well region 3 are formed on a surface layer of a p-semiconductor substrate 1 connected to a GND potential. A C-MOS circuit of a low-side circuit and the like, for example, are formed within the n-well region 2. A level shift circuit or a C-MOS circuit of a high-side circuit and the like, for example, are formed in the n-well region 3.

The level shift n-channel MOSFET 41 has an n-well region 4, a p-region 51 in contact with the n-well region 4, an n-source region 53 and a p-contact region 54 that are formed on a surface layer of the p-region 51, an n-drain region 52 formed on a surface layer of the n-well region 4, and a gate electrode 55 that is formed between the n-source region 53 and the n-drain region 52 and on the p-region 51 with a gate oxide film therebetween.

The drain region 52 of the n-channel MOSFET 41 is connected to the H-VDD via the level shift resistor 71 by a surface metal wire. The high-voltage integrated circuit device 500 has the connection between the drain region 52 of the n-channel MOSFET 41 and the level shift resistor 71 as the output part 101.

The output part 101 outputs a low potential when the level-up n-channel MOSFET 41 is turned on, and outputs a high potential when the level-up n-channel MOSFET 41 is turned off. For this reason, the high-voltage integrated circuit device 500 can perform a level shift operation for transmitting signals between different reference potentials.

As described above, a surge of negative potential in relation to the GND potential is input the Vs terminal at the time when the upper arm IGBT 115 is turned off. This voltage $V_s$ can be calculated using the following equation (1).

$$V_s = L \times dI/dt \quad (1)$$

When the voltage $V_s$ is lower than GND potential—($V_{supply}+V_f$), an internal parasitic diode of a semiconductor chip starts flowing. Note that $V_{supply}$ is a battery voltage of the high-side power supply 113 or a battery voltage between ends of a bootstrap capacitor, not shown. Referential mark $V_f$ indicates a forward voltage drop of parasitic diodes 45, 46.

When the voltage $V_f$ is significantly pulled toward the negative side, an overcurrent flows in the chip, causing an erroneous operation in the high-side circuit or damaging the chip. During the period in which the voltage $V_s$ is pulled toward the negative side, it takes about several hundreds of ns to 500 ns for a spike-like negative surge of approximately −30 V to be input to the Vs terminal, in proportion to a product of dI1/dt that is obtained from a period for turning off an on-current I1 flowing in the parasitic inductance component (L1) and the IGBT 115, the parasitic inductance component being generated in a wire on the printed board or a cable to the load.

FIG. 14 is a layout diagram showing substantial parts such as the high-side circuit shown in FIG. 13, a level shifter, and the like. An H-VDD pad, an H-OUT pad, a Vs pad, and an intermediate-potential region are formed in the n-well region 3, a high-potential region. The intermediate-potential region includes a p-offset region 31 and a p-drain region 34. A belt-like n-contact region 62 is formed on a surface layer on an outer circumference of the n-well region 3. First pickup electrodes 81 are scattered on the n-contact region 62. The n-well region 4 is formed so as to surround the n-well region 3. A p-region 61 is formed so as to surround the n-well region 4.

A belt-like p-contact region 56 is formed on a surface layer of the p-region 61. Second pickup electrodes 82 are scattered on the p-contact region 56. The n-well region 2, which is a low-potential region, is formed so as to surround the p-region 61. The low-side circuit shown in FIG. 13 is formed in the n-well region 2. A level shifter is formed on a surface layer of the p-region 51 between the n-contact region 62 and the p-region 61. The n-contact region 62 and the p-region 61, as well as the n-well region and the p-region 51 that are sandwiched between these regions, configure a high-voltage junction terminating region. The p-region 51 and the n-well region 4 that form the level shifter are in contact with each other.

In order to reduce the size of the chip by efficiently arranging the regions described above, a part of the intermediate-potential region is disposed in proximity to the n-contact region 62. This section proximal to the n-contact region 62 is denoted with "E." The section E proximal to the n-contact region 62 is where the intermediate-potential region faces the high-voltage junction terminating region and where a distance W between the intermediate-potential region and the high-voltage junction terminating region is the smallest (referred to as "opposition section E" hereinafter).

As this type of high-voltage integrated circuit, there has been disclosed a high-voltage integrated circuit chip, which has a resistor between a substrate and a ground to limit a current flowing through a negative-voltage spike in a circuit that protects a high-voltage integrated circuit driving a power transistor having a half-bridge configuration and expects an excessive negative movement in an output node (point) (see Patent Literature 1, for example).

Moreover, as a high-voltage integrated circuit device, there has been disclosed a device that diminishes the impact of a reverse bias by inserting a diode between a drain electrode of a switching element belonging to a level shifter and a gate electrode of a MOS transistor belonging to an amplifier (C-MOS circuit) (see Patent Literature 2, for example).

In addition, as another high-voltage integrated circuit device, there has been disclosed a device in which a drain of a switching element belonging to a level shifter, a level shift resistor, and a current restricting resistor are connected to one another in series, and an interval between the level shift resistor and the current restricting resistor is configured as an output part of a level-up circuit (see Patent Literature 3, for example).

As yet another high-voltage integrated circuit device, the following device is disclosed. In this device, a high-voltage diode (D3) is provided between a common ground node (COM) and a virtual ground node (VS) within a high-voltage control circuit (HVIC) by using a common substrate region. This configuration can reliably prevent a decrease in high-potential side power supply voltage, which is caused by an undershoot of a negative voltage occurring at a high-potential side reference potential (virtual ground VS), in a power device driving circuit (see Patent Literature 4, for example).

Patent Literature 1: Japanese Patent Publication No. 3346763

Patent Literature 2: Japanese Patent Application Publication No. 2001-25235

Patent Literature 3: Japanese Patent Application Publication No. 2008-301160

Patent Literature 4: Japanese Patent Application Publication No. 2010-263116

However, the conventional high-voltage integrated circuit devices described above have the following problems. A case example is described in which, at the connection between the switching power device and the HVIC in FIG. 9, the Vss has a potential of approximately 1200 V and the H-VDD has a potential higher than that of the Vs by approximately 15 V. When the upper arm IGBT 115 is operated and the lower arm IGBT 114 is off, a current flows from the upper arm IGBT 115 to the L load 118.

In this state, when the upper arm IGBT 115 is turned off, the L load 118 attempts to maintain the current. As a result, a current flows from the GND via the lower arm FWD 116, making the potential of the Vs terminal lower than the GND potential to approximately −30 V. When the potential of the Vs terminal becomes approximately −30 V, the potential of the H-VDD terminal becomes approximately −15 V.

In the structure of the high-voltage integrated circuit device shown in FIG. 13, the potentials of the p-semiconductor substrate 1 and the p-region 61 are equivalent to the GND potential. A case example is described in which the potential of the Vs terminal decreases to a level where the potentials of the n-well regions 3 and 4 become lower than the GND potential.

The parasitic diode 45 configured by the p-semiconductor substrate 1 and the n-well region 3, and the parasitic diode 46 configured by the p-region 61 and the n-well region 4 are forward-biased, and consequently a large current flows. This current flows via a space between the gate and the source of the IGBT 115. Because this path does not contain any resistor components for restricting the current, the current flowing therethrough becomes an extremely large pulse current. This pulse current destroys the HVIC or causes an erroneous operation therein.

In addition, applying a negative-voltage surge to the Vs pad (terminal) or the H-VDD pad (terminal) in FIGS. 13 and 14 causes electron hole injection where electron holes are injected from the p-region 61 to the n-well region 4 configuring the parasitic diode 46. Especially in the opposition section E of the high-voltage junction terminating region, whose distance W to the intermediate-potential region is short, the resistance of the n-well region 4 (a cathode resistance of the parasitic diode 46) between the intermediate-potential region and the p-region 61 becomes small compared to the other sections. Therefore, the amount of electron holes between the p-region 61 and the n-well region 4 is large compared to the other sections.

The electron holes injected into the n-well region 4 flow to the p-offset region 31 and the p-drain region 36 (when an ON signal is input to the gate electrode 39), which are Vs potential regions with negative potentials, through below the n-contact region 62. The electron holes entering the p-offset region 31 are pulled out from the p-contact region 38 toward the Vs terminal.

However, some of the electron holes enter below the n-source region 37 and becomes a gate current of a parasitic npn transistor configured by the n-source region 37, the p-offset region 31, and the n-well region 3. When the parasitic npn transistor is turned on, the logic part of the high-side circuit is likely to be operated erroneously.

Also, the electron holes entering below the n-source region 37 turn on (latch up) a parasitic thyristor configured by the n-source region 37, the p-offset region 31, the n-well region 3, and the p-semiconductor substrate 1, destroying the high-side circuit. When some of the electron holes flow toward the p-drain region 34 through the n-well region 3, the logic part of the high-side circuit is still likely to be operated erroneously.

In the technology of Patent Literature 1 described above, the resistor for limiting a current is connected to the interval between the GND (earth ground) terminal and the substrate. This technology does not mention about connections of the sections other than this interval. This resistor is formed of a polysilicon layer. Therefore, when a large pulse current (several A to several tens of A) of negative voltage transiently flows to the parasitic diode between the Vs terminal and the GND terminal, the polysilicon layer might be thermally dissolved and destroyed.

In the technology of Patent Literature 2 described above, the diode is connected in order to diminish the impact of a reverse bias. This technology, however, does not mention about a resistor or a layout method that limits a current of a body diode or a parasitic diode when the potential of the H-VDD becomes negative due to the L load.

In the technology of Patent Literature 3 described above, the current restricting resistor is connected to a path between the high-potential side (H-VDD) and the low-potential side (ground) of the Vs-based low-voltage power supply of the level shift circuit. In this manner, a body diode or a parasitic diode of the n-channel MOSFET is prevented from being destroyed by an overcurrent, and a section of the level shift circuit that has a small current capacity is also prevented from being destroyed by an overcurrent. This technology, however, does not mention about how to prevent a parasitic erroneous operation (erroneous inversion) of the Vs-based high-side circuit.

In the technology of Patent Literature 4 described above, the high-voltage diode (D3) is provided between the Vs terminal and the substrate of the high-voltage control circuit (HVIC) on the GND potential side, but does not mention about providing the high-voltage diode (D3) between a VB terminal, which is a bootstrap power supply node, and the substrate of the high-voltage control circuit (HVIC) on the GND potential side.

DISCLOSURE OF THE INVENTION

In order to solve the problems of the conventional technologies described above, the present invention aims to provide a high-voltage integrated circuit device that is capable of preventing an erroneous operation or destruction of a high-side circuit when a negative-voltage surge is applied to an H-VDD terminal or a Vs terminal.

In order to solve the problems described above and achieve the object of the present invention, a high-voltage integrated circuit device according to the present invention is a high-voltage semiconductor integrated circuit device that drives a high-potential-side power transistor out of two serially connected power transistors, and has the following characteristics. The high-voltage semiconductor integrated circuit device has: a high-potential region of second conductivity type that is formed on a surface layer of a semiconductor substrate of first conductivity type; a breakdown voltage region of second conductivity type that is formed on the surface layer of the semiconductor substrate, in contact with the high-potential region and along an outer circumference of the high-potential region, and that has an impurity concentration lower than that of the high-potential region; a ground potential region of first conductivity type that is formed on the surface layer of the semiconductor substrate, in contact with the breakdown voltage region and along an outer circumference of the breakdown voltage region, and that is applied with a ground potential; a low-potential region of second conductivity type that is formed outside the ground potential region on the surface layer of the semiconductor substrate; an intermediate-potential region of first conductivity type that is formed within the high-potential region so as to be joined to and separated from the high-potential region; a first contact region of second conductivity type that is formed along an end part of the breakdown voltage region that is on the high-potential region side; a second contact region of first conductivity type that is formed on a surface layer of the ground potential region so as to face the first contact region; a first pickup electrode that is in contact with the first contact region; and a second pickup electrode that is in contact with the second contact region. The intermediate-potential region is a region to which is applied an intermediate potential between a high-potential-side potential and a ground potential of a high-voltage power supply, which is a main circuit power supply of the two serially connected power transistors. The low-potential region is a region to which is applied a high-potential-side potential of a first low-voltage power supply based on the ground potential. The high-potential region is a region to which is applied a high-potential-side potential of a second low-voltage power supply based on the intermediate potential. A high-voltage junction terminating region, which is configured by the breakdown voltage region, the ground potential region, the first contact region and the second contact region, is formed. In a section of the high-voltage junction terminating region, whose distance to the intermediate-potential region is shorter than those of other sections, a resistance of a current path between the first pickup electrode and the second pickup electrode is higher than those of the other sections.

This invention can attain the following effects. FIG. 15 is a diagram showing a relationship between a negative-voltage surge and a distance between a contact region and an intermediate-potential region. FIG. 15 shows a distance between a contact region 62 and the p-offset region 31, which is the intermediate-potential region, in relation to a guaranteed voltage obtained when the negative-voltage surge is applied, in accordance with the configuration of the high-voltage integrated circuit device shown in FIGS. 13 and 14.

When the guaranteed voltage for preventing an erroneous operation is −30V (the pulse width is 500 ns) as shown in FIG. 15, the distance between the contact region 62 and the p-offset region 31 needs to be at least 100 μm. However, providing a distance of at least 100 μm between a contact region and an intermediate-potential region in all regions leads to an increase in the number of invalid regions due to the layout; which is not preferred in terms of area efficiency. For this reason, the distance between the contact region and the intermediate-potential region is made shorter than 100 μm, and, in return, the resistance of the current path between the first pickup electrode and the second pickup electrode is increased. In this manner, the amount of electron holes flowing into the intermediate-potential region can be reduced, preventing the occurrence of an erroneous operation.

In regions other than the intermediate-potential region, which face the high-voltage junction terminating region, regions where erroneous operations are not caused by negative voltages, such as the level shift resistor 71 and the diode 75 shown in FIG. 10, are formed. Thus, the electron holes dominantly flow into the regions other than the intermediate-potential region through the high-voltage junction terminating region (the other sections) having a low resistance value.

In order to solve the problems described above and achieve the object of the present invention, a high-voltage integrated circuit device according to the present invention is a high-voltage semiconductor integrated circuit device that drives a high-potential-side power transistor out of two serially connected power transistors, and has the following characteristics. The high-voltage semiconductor integrated circuit device has: a high-potential region of second conductivity type that is formed on a surface layer of a semiconductor substrate of first conductivity type; a separation region of first conductivity type that splits a part of an outer circumference of the high-potential region; a breakdown voltage region of second conductivity type that is formed on the surface layer of the semiconductor substrate, in contact with the high-potential region and along the outer circumference of the high-potential region, and that has an impurity concentration lower than that of the high-potential region; a ground potential region of first conductivity type that is formed on the surface layer of the semiconductor substrate, in contact with the separation region and along an outer circumference of the breakdown voltage region, and that is applied with a ground potential; a low-potential region of second conductivity type that is formed outside the ground potential region on the surface layer of the semiconductor substrate; an intermediate-potential region of first conductivity type that is formed within the high-potential region so as to be joined to and separated from the high-potential region; a first contact region that is formed along an end part of the breakdown voltage region that is on the high-potential region side; a second contact region that is formed on a surface layer of the ground potential region; a first pickup electrode that is in contact with the first contact region; and a second pickup electrode that is in contact with the second contact region. The intermediate-potential region is a region to which is applied an intermediate potential between a high-potential-side potential and a ground potential of a high-voltage power supply, which is a main circuit power supply of the two serially connected power transistors. The low-potential region is a region to which is applied a high-potential-side potential of a first low-voltage power supply based on the ground potential. The high-potential region is a region to which is applied a high-potential-side potential of a second low-voltage power supply based on the intermediate potential. A high-voltage junction terminating region, which is configured by the breakdown voltage region, the ground potential region, the first contact region and the second contact region, is formed. In a section of the high-voltage junction terminating region, whose distance to the intermediate-potential region is shorter than those of other sections, a resistance of a current path between the first pickup electrode and the second pickup electrode is higher than those of the other sections.

In the invention described above, the high-voltage integrated circuit device according to the present invention is characterized in that the resistance is made higher than those of the other sections by forming the first pickup electrode, except for the section of the high-voltage junction terminating region, whose distance to the intermediate-potential region is shorter than those of the other sections.

In the invention described above, the high-voltage integrated circuit device according to the present invention is characterized in that the resistance is made higher than those of the other sections by forming the second pickup electrode, except for the section of the high-voltage junction terminating region, whose distance to the intermediate-potential region is shorter than those of the other sections.

In the invention described above, the high-voltage integrated circuit device according to the present invention is characterized in that the resistance is made higher than those of the other sections by electrically insulating at least between the first contact region and the first pickup electrode or between the second contact region and the second pickup electrode, in the section of the high-voltage junction terminating region, whose distance to the intermediate-potential region is shorter than those of the other sections.

In the invention described above, the high-voltage integrated circuit device according to the present invention is characterized in that the resistance is made higher than those of the other sections by configuring a double RESURF structure by forming a semiconductor region of the same conductivity type as the ground potential region on a surface layer of the high-voltage junction terminating region and away from the high-potential region and the ground potential region, in the section of the high-voltage junction terminating region, whose distance to the intermediate-potential region is shorter than those of the other sections.

In the invention described above, the high-voltage integrated circuit device according to the present invention is characterized in that the resistance is made higher than those of the other sections by stretching the breakdown voltage region toward the low-potential region, in the section of the high-voltage junction terminating region, whose distance to the intermediate-potential region is shorter than those of the other sections.

According to the invention described above, the electron hole injection that is caused when a negative-voltage surge is input can be locally diminished by providing the section of the high-voltage junction terminating region, whose distance to the intermediate-potential region is shorter than those of the other sections, with the resistance higher than those of the other sections.

The high-voltage integrated circuit device according to the present invention can achieve the effect of preventing an erroneous operation or destruction of a logic part of a high-side circuit.

BRIEF DESCRIPTION OF THE DRAWINGS

FIG. 14 is a layout diagram showing substantial parts such as the high-side circuit shown in FIG. 13, a level shifter, and the like;

BEST MODE FOR CARRYING OUT THE INVENTION

Figure 1:
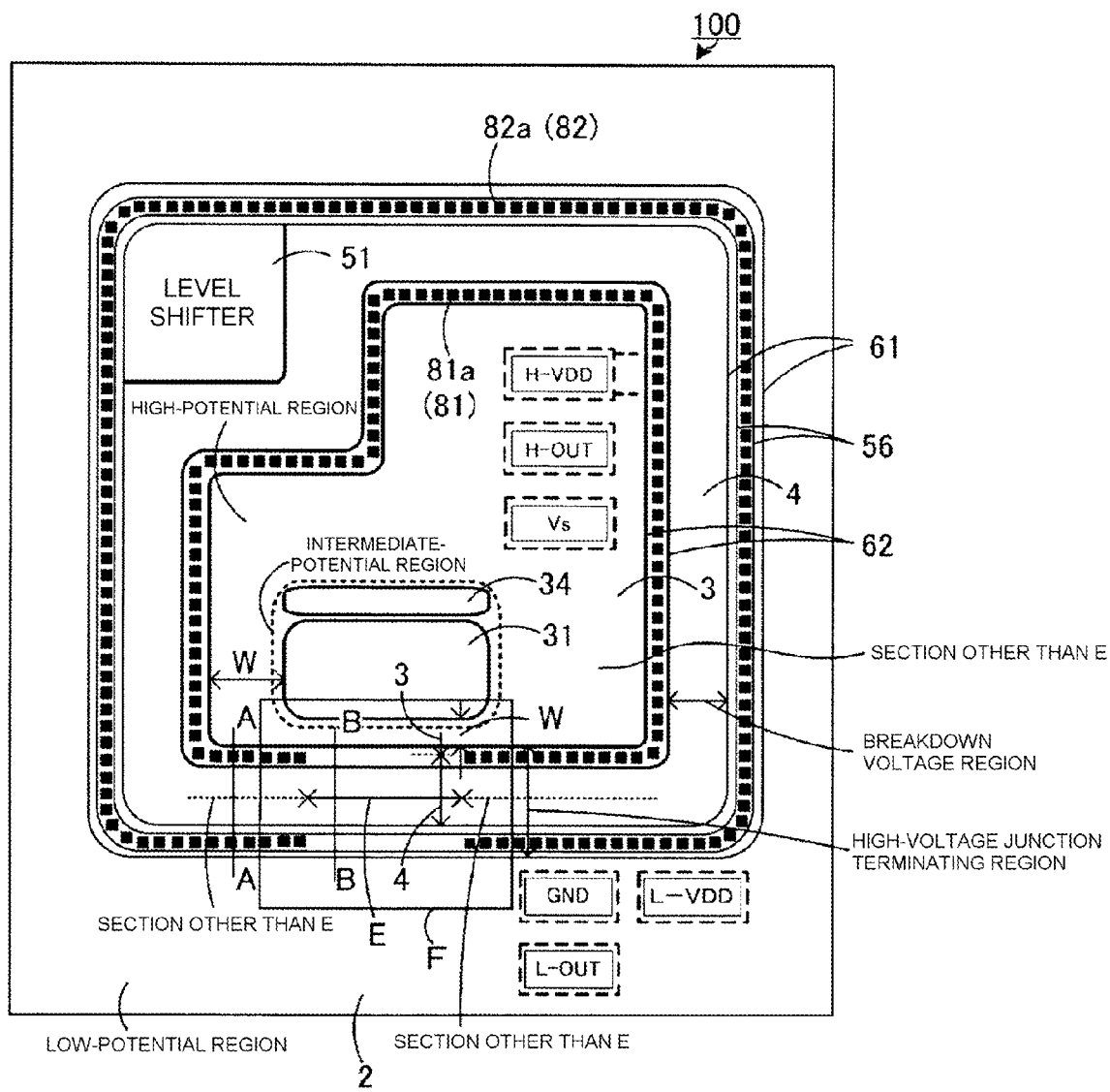
FIG. 1 is a plan view showing substantial parts of a high-voltage integrated circuit device according to Embodiment 1 of the present invention.

Preferred embodiments of a high-voltage integrated circuit device according to the present invention are described hereinafter in detail with reference to the accompanying drawings. The same reference numerals are used for explaining the same parts as those of a conventional structure. In the following description, means p-type and "n" means n-type. Each of the following embodiments describes only a level-up NMOS as a level shifter, but the same effects can be achieved with a level-down PMOS as well.

Circuits shown in FIGS. 9 to 12 are described in the following embodiments.

(Embodiment 1)

Figure 2:
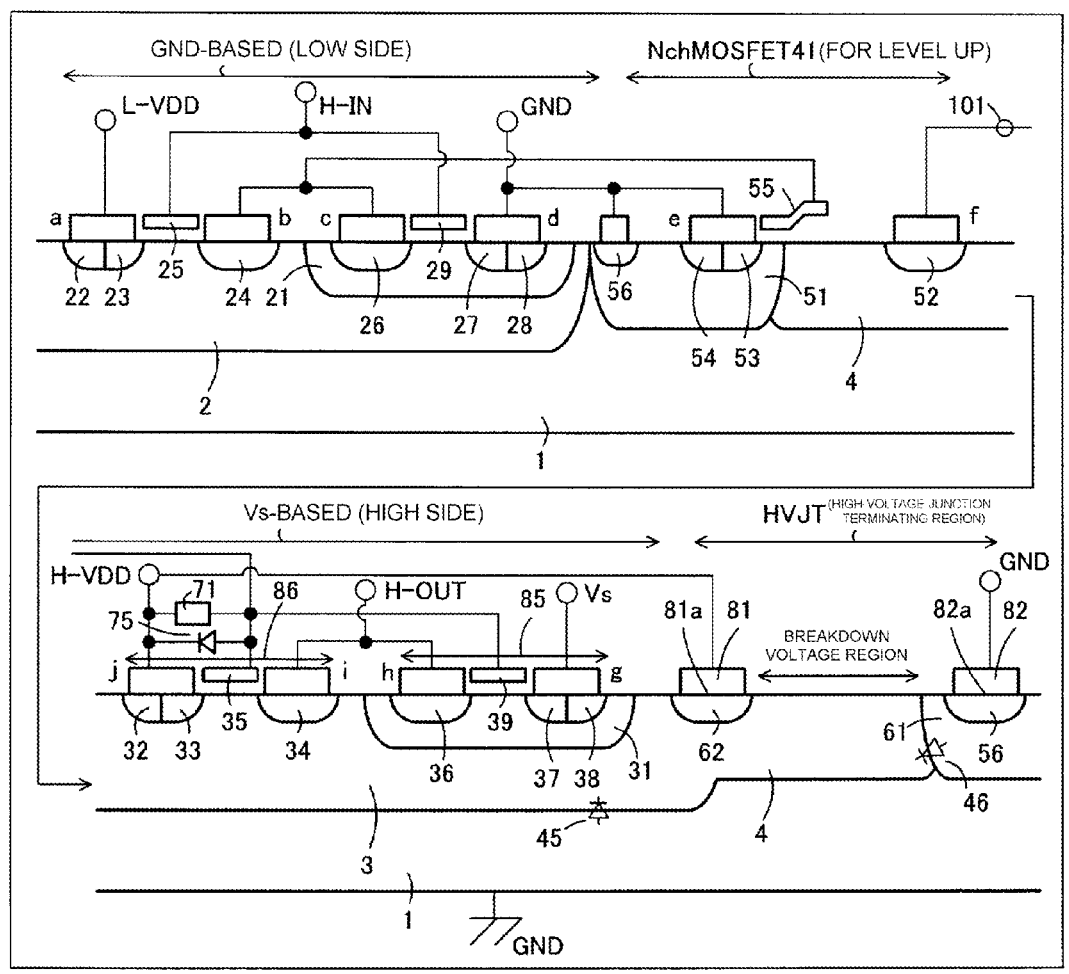
FIG. 2 is a cross-sectional diagram showing the entire substantial parts, taken along a section line A-A of FIG. 1 in a parallel direction.

FIG. 1 is a plan view showing substantial parts of a high-voltage integrated circuit device 100 according to Embodiment 1 of the present invention. FIG. 2 is a cross-sectional diagram showing the entire substantial parts, taken along a section line A-A of FIG. 1 in a parallel direction. In FIGS. 1 and 2 the same reference numerals are used for explaining the configurations corresponding to the configurations shown in FIGS. 9 to 13.

Figure 3:
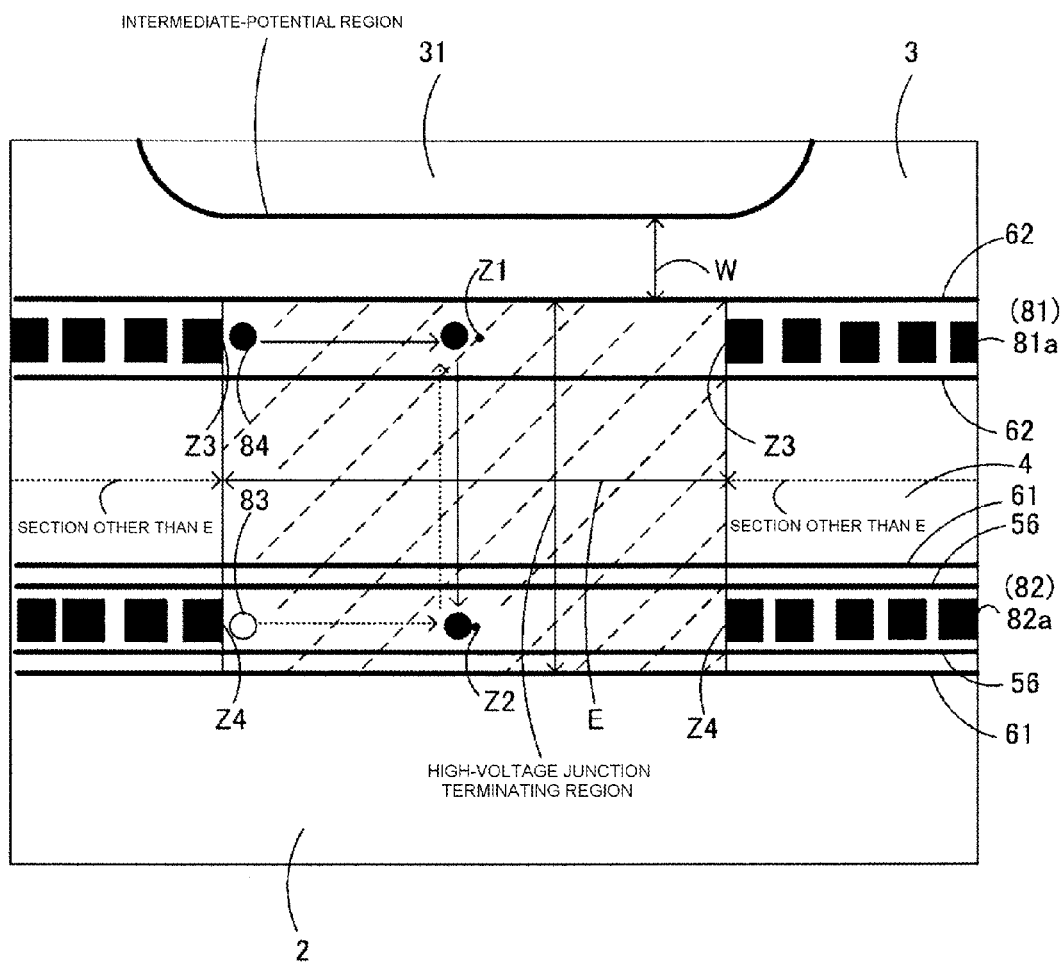
FIG. 3 is a substantial plan view showing flows of an electron hole and an electron by using an enlarged view of an F part shown in FIG. 1.

FIG. 3 is a substantial plan view showing flows of an electron hole and an electron by using an enlarged view of an F part shown in FIG. 1. Note that a region shown in diagonal dashed lines represents a section (opposition section) E in which a part of an intermediate-potential region is disposed in proximity to an n-contact region 62. This section E is a section of a high-voltage junction terminating region, whose distance W to the intermediate-potential region is shorter than those of other sections.

Figure 4:
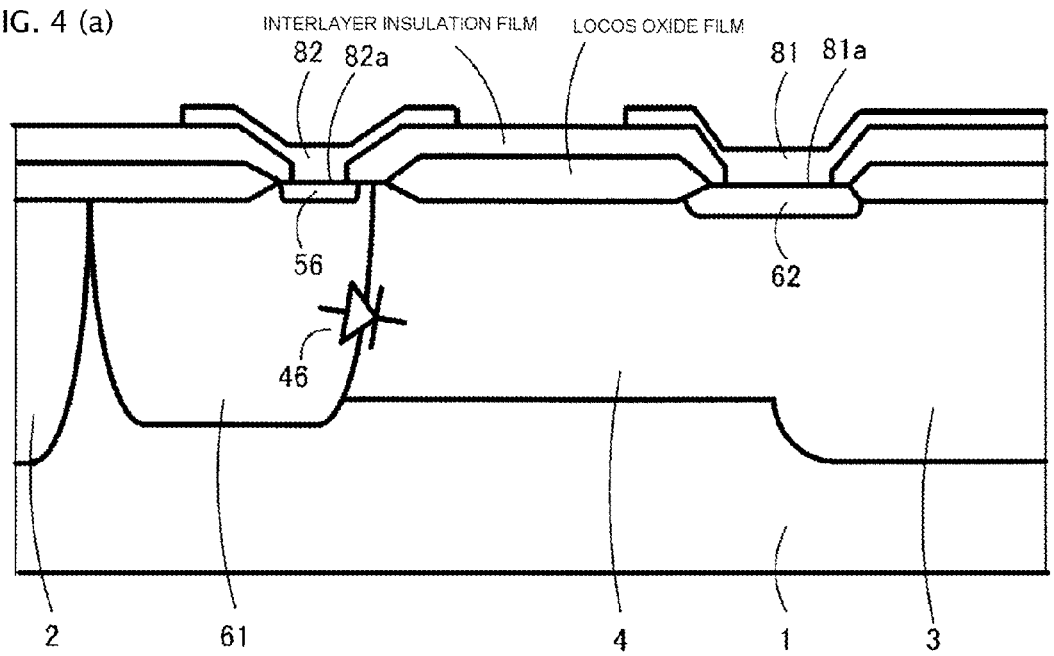
FIG. 4 is a substantial cross-sectional diagram of a high-voltage junction terminating structure of FIG. 1 and its periphery.
Figure 4:
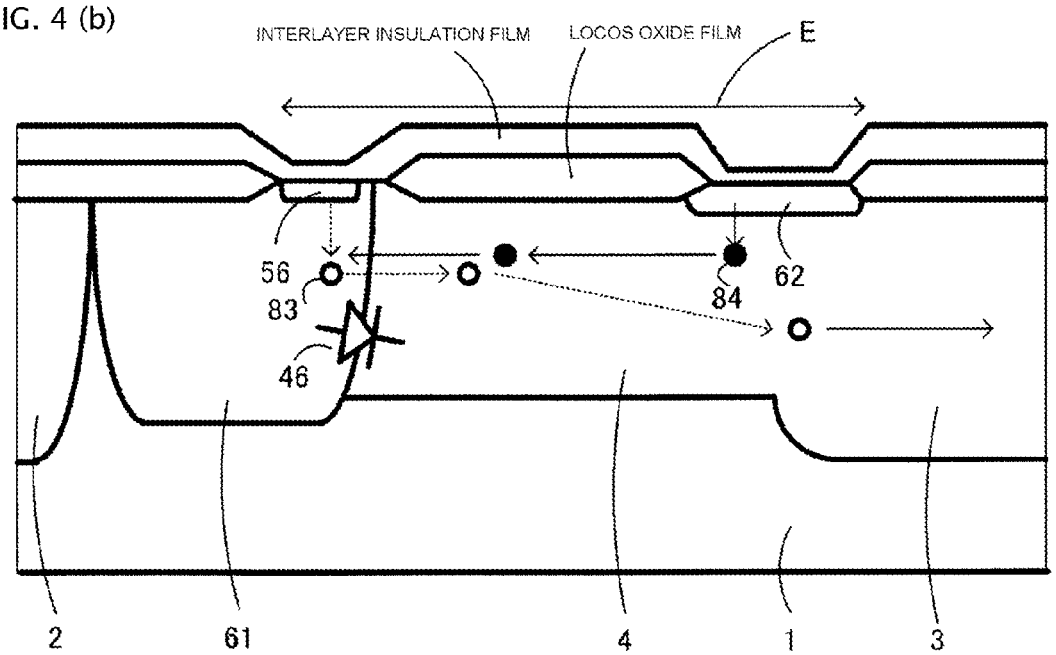

FIG. 4 is a substantial cross-sectional diagram of the high-voltage junction terminating structure of FIG. 1 and its periphery. FIG. 4(a) is a substantial cross-sectional diagram showing the cross-sectional structure taken along the section line A-A of FIG. 1. FIG. 4(b) is a substantial cross-sectional diagram showing a cross-sectional structure taken along a section line B-B of FIG. 1. The cross-sectional diagram of FIG. 2 is same as the cross-sectional diagram of FIG. 13. A high side shown in FIG. 2 means a region that includes a high-potential region to which is applied a potential superimposed with an L-VDD potential (H-VDD potential), a Vs potential as a reference potential, and an intermediate-potential region to which the Vs potential is applied. A low side means a region that includes a low-potential region to which is applied the L-VDD potential, a GND as a reference potential, and a ground potential region to which a GND potential is applied.

In FIGS. 1 to 4, an n-well region 3 is positioned on the high side. An H-VDD pad, an H-OUT pad, a Vs pad, and the intermediate-potential region are formed on the n-well region 3. These pads correspond to terminals shown in FIG. 2.

The intermediate-potential region has a p-offset region 31 and a p-drain region 34. The p-drain region 34 is an intermediate-potential region because the potential thereof becomes the Vs potential when an nMOSFET 85 configured by an n-source region 37 and an n-drain region 36 shown in FIG. 2 is turned on.

However, when the nMOSFET 85 is off, a pMOSFET 86 configured by a p-source region 33 and the p-drain region 34 is turned on, turning the p-drain region 34 into a high-potential region. In other words, the p-drain region 34 becomes either an intermediate-potential region or a high-potential region. In the case of the present embodiment, the intermediate-potential region includes the p-offset region 31 and the p-drain region 34 but is not limited thereto.

The low-potential region includes a p-region 61, a p-region 51 configuring a level shifter (a NchMOSFET 41 shown in FIG. 2), and a p-semiconductor substrate 1 shown in FIG. 2. An n-source region 53 of the NchMOSFET 41 is formed on a surface layer of the p-region 51. An n-drain region of the NchMOSFET 41 corresponds to an n-well region 4.

The high-voltage junction terminating region includes the n-well region 4 and the p-region 61, the n-well region 4 being disposed between and including a highly-concentrated n-contact region 62 and a highly-concentrated p-contact region 56. The n-well region 4 becomes a breakdown voltage region, a region spreading mainly a depletion layer, when being applied with a reverse bias in order to be pn-joined to the p-region 61. An n-well region 2 corresponds to the low-potential region. An L-VDD terminal and an L-OUT terminal are formed in the n-well region 2. A ground potential region corresponds to the p-region 61. A GND terminal is formed in the p-region 61.

As shown in FIG. 1, a belt-like n-contact region 62 is formed on surface layers of the n-well region 4 and the n-well region 3 so as to surround the n-well region 3 and extend over the n-well regions 3 and 4. Belt-like first pickup electrodes 81 are formed on this belt-like n-contact region 62. Contact parts 81a are in an ohmic contact and scattered between the n-contact region 62 and the first pickup electrodes 81. The contact parts 81a may be in the shape of a belt.

The n-well region 4 is formed so as to surround the n-well region 3 and become continuous with the n-well region 3. The p-region 61 is formed so as to surround the n-well region 4. The p-region 61 is formed into a belt, and the p-contact region 56 is formed into a belt on a surface layer of the p-region 61. Belt-like second pickup electrodes 82 are formed on the belt-like p-contact region 56. Contact parts 82a are in ohmic contact and scattered between the p-contact region 56 and the second pickup electrodes 82. The contact parts 82a may be in the shape of a belt.

The n-well region 2, the low-potential region, is formed in contact with the p-region 61. A low-side circuit (the low side shown in FIG. 2) is formed in this n-well region 2. The level shifter is formed in the p-region 51. The p-region 51 is formed on a surface layer of the p-semiconductor substrate 1 so as to make contact with the n-well region 4 and protrude toward the p-region 61. However, for the sake of convenience, FIG. 1 shows that the protruding section is in contact with the p-region 61.

The first pickup electrodes 81 connected to an H-VDD terminal and the second pickup electrodes 82 connected to the GND terminal are formed on the n-contact region 62 and the p-contact region 56, respectively. The contact parts 81a, 82a between the first and second pickup electrodes 81, 82 and the contact regions 62, 56 are scattered as described above. The contact parts 81a, 82a may be formed into belts.

In Embodiment 1, in the opposition section E of the high-voltage junction terminating region, whose distance W to the intermediate-potential region (here, the p-offset region 31) is shorter than those of the other sections, none of the first pickup electrodes 81 or the second pickup electrodes 82 are disposed on the n-contact region 62 and the p-contact region 56. Instead of eliminating the first and second pickup electrodes 81, 82, the first and second pickup electrodes 81, 82 may be disposed without providing the contact parts 81a, 82a. For example, insulation films may be disposed between the contact regions 56, 62 and the first and second pickup electrodes 81, 82, to eliminate the contact parts 81a, 82a.

Note in FIGS. 1 and 2 that an end part of the intermediate-potential region (an end part of the p-offset region 31) and an end part of the n-contact region 62 are disposed in parallel with each other in the opposition section E. In this manner, in the opposition section E of the high-voltage junction terminating region, whose distance W to the intermediate-potential region is shorter than those of the other sections, a resistance between the first pickup electrodes 81 and the second pickup electrodes 82 can be made greater than those of the other sections.

Figure 10:
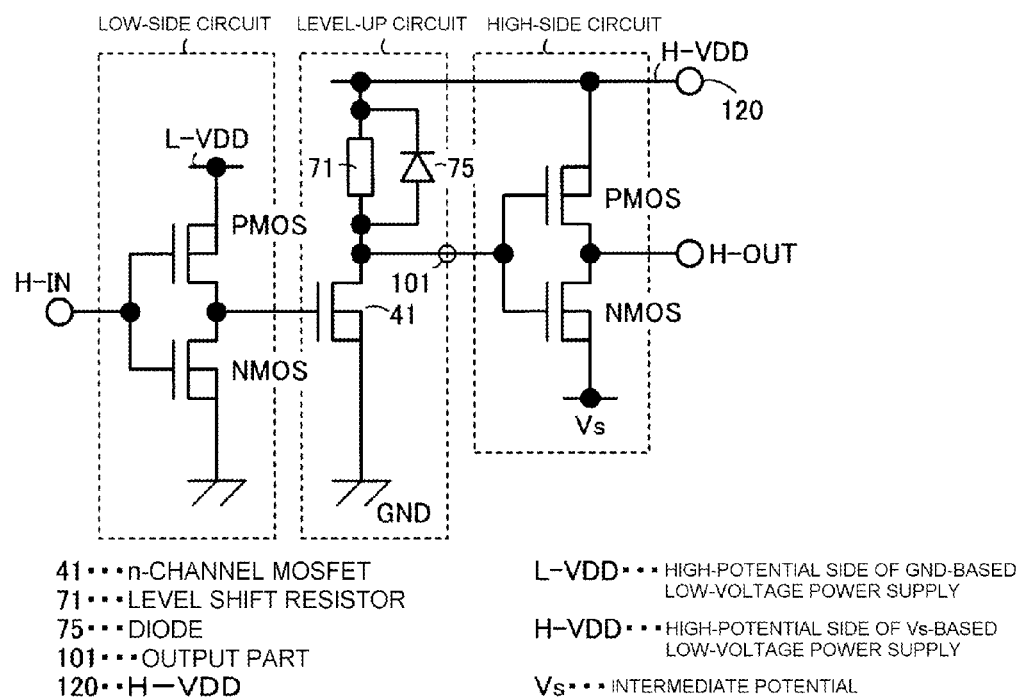
FIG. 10 is a circuit diagram showing a level-up circuit and a peripheral circuit thereof.
Figure 11:
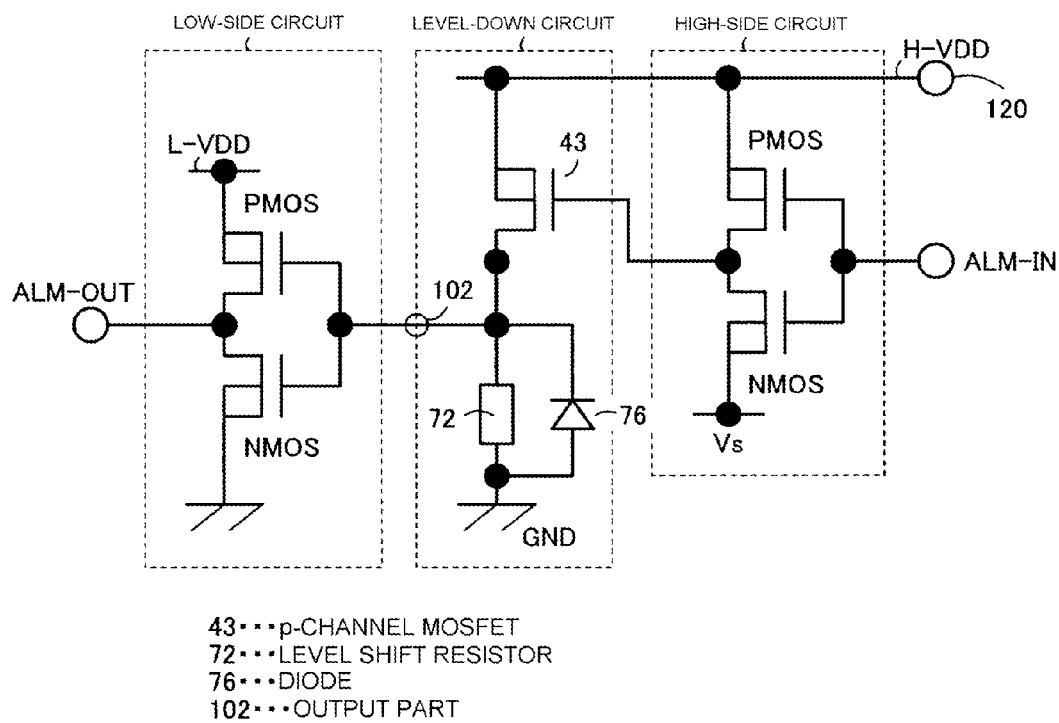
FIG. 11 is a circuit diagram showing a level-down circuit and a peripheral circuit thereof.
Figure 12:
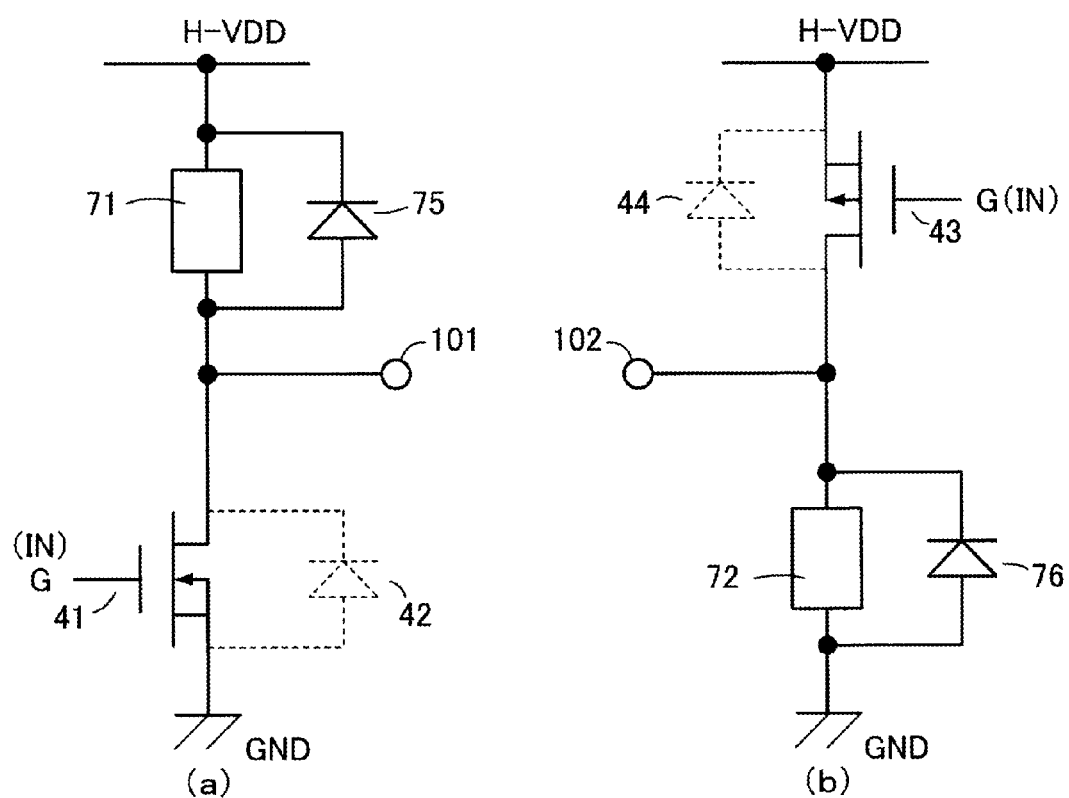
FIG. 12 is a detail diagram of a level shift circuit of the conventional HVIC.
Figure 13:
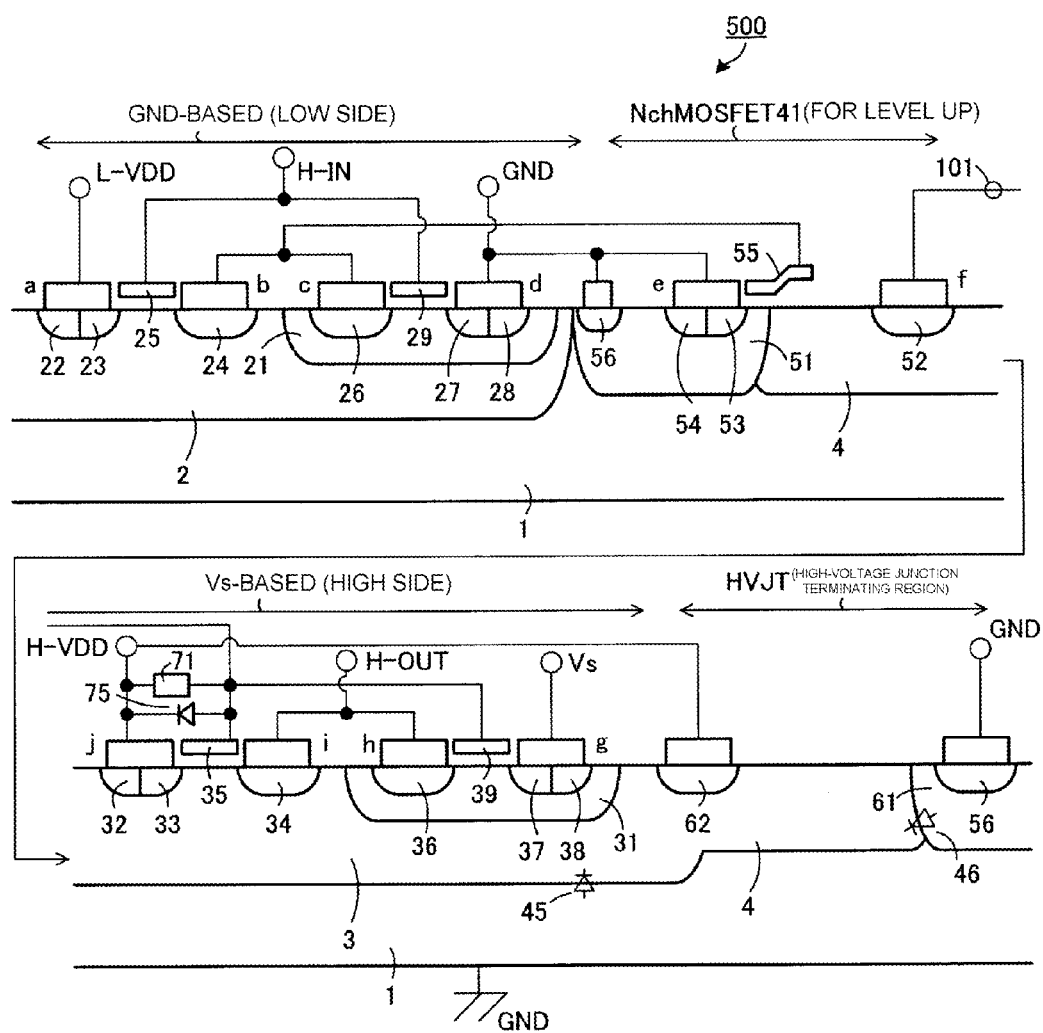
FIG. 13 is a cross-sectional diagram showing substantial parts of a logic part, a level-cup circuit part, and a high-voltage junction terminating region (HVJT) of each of high-side and low-side circuits of a conventional self-separation type high-voltage integrated circuit device.
Figure 14:
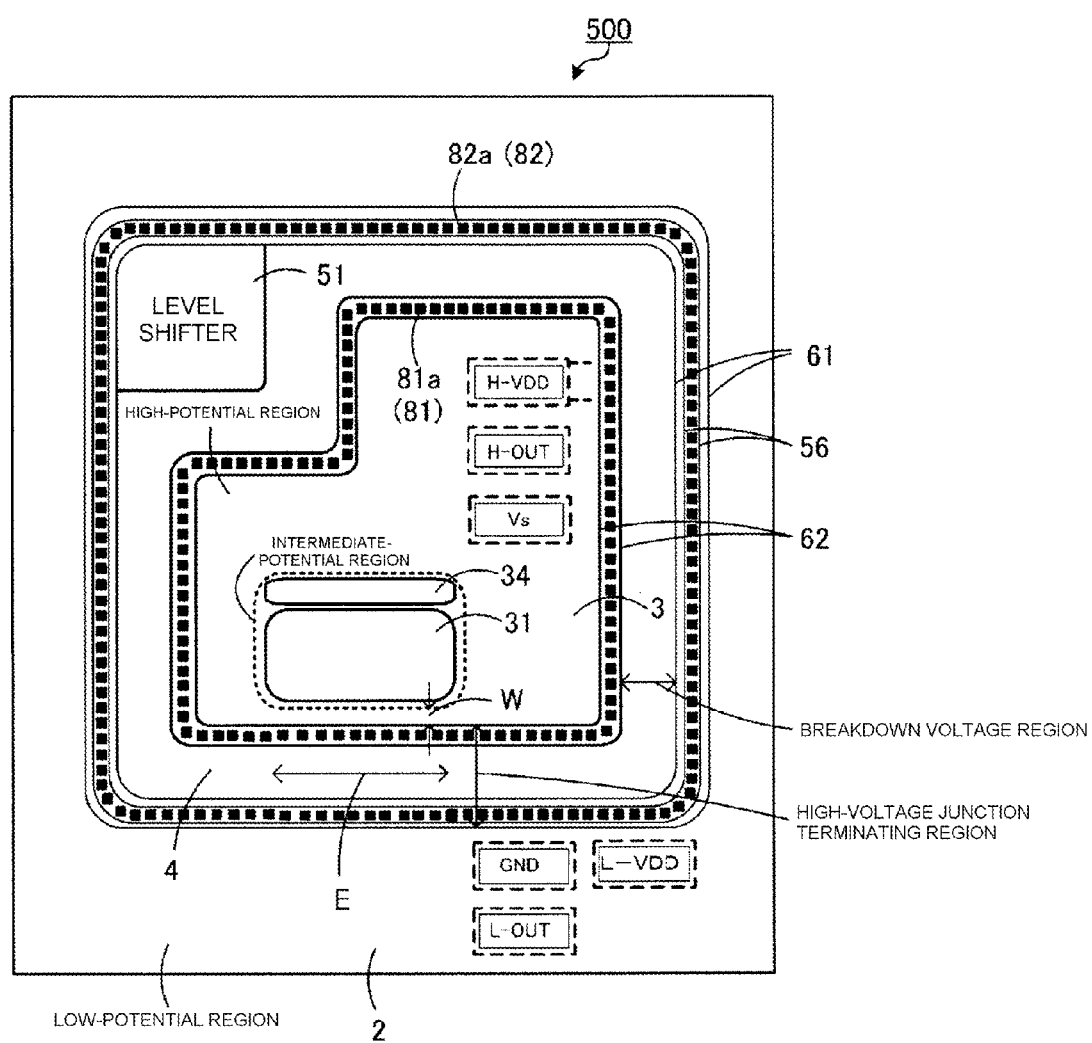
Figure 15:
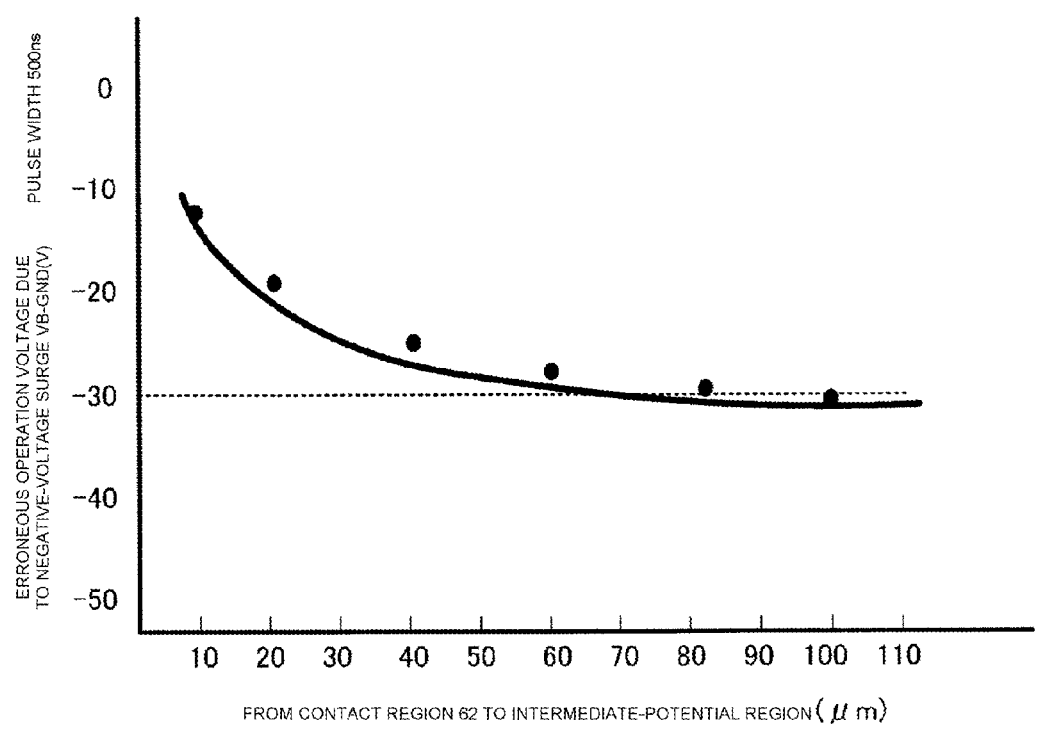
FIG. 15 is a diagram showing a relationship between a negative-voltage surge and a distance between a contact region and an intermediate-potential region.

Moreover, when the distance W to the intermediate-potential region is long enough to ensure a guaranteed voltage for preventing the occurrence of an erroneous operation, a region where an erroneous operation is not caused by a negative voltage, such as a level shift resistor 71 or a diode 75 shown in FIG. 10, is formed in a region between the intermediate-potential region and the high-voltage junction terminating region. Therefore, an electron hole, which enters the n-well region 4 at the time of the input of a negative-voltage surge, flows dominantly into a region other than the E region through the high-voltage junction terminating region (other sections) having a low resistance value.

The reasons thereof are described using FIGS. 3 and 4. In FIG. 3, a middle point between the contact parts 81a facing each other in the n-contact region 62 where none of the first pickup electrodes 81 (contact parts 81a) are formed is taken as Z1, and a middle point between the contact parts 82a facing each other in the p-contact region 56 where none of the second pickup electrodes 82 (contact parts 82a) are formed is taken as Z2. An end part in which the first pickup electrodes 81 are discontinued (the end of the contact parts 81 a) is taken as Z3 (there are two Z3 on the left and right), and an end part in which the second pickup electrodes 82 are discontinued (the end of the contact parts 82a) is taken as Z4 (there are two Z4 on the left and right).

Next are described an electron 84 that flows from Z1 to Z2 and an electron hole 83 that flows from Z2 to Z1 when a negative-voltage surge is input. The electron 84 enters the n-contact region 62 from the end part Z3 where the first pickup electrodes 81 (the contact parts 81 a) are discontinued as shown in FIG. 3. After flowing to Z1 through the belt-like n-contact region 62, the electron 84 enters the n-well region 4 from the n-contact region 62. The diagram shows only a one-way path (solid line). Thereafter, the electron 84 flows through the n-well region 4 toward Z2. Because the electron 84 entering the n-well region 4 from the point Z1 flows through a long path along the belt-like n-contact region 62, the resistance thereof increases and the amount of electrons 84 decreases significantly. Compared to the amount of electrons 84 entering the n-well region 4 from the n-contact region 62 in a section other than the opposition section E that comes into contact with the first pickup electrodes 81, the amount of electrons 84 entering the n-well region 4 from the n-contact region 62 of the opposition section E that does not come into contact with the first pickup electrodes 81 is low.

On the other hand, the electron hole 83 enters the p-contact region 56 from the end part Z4 where the second pickup electrodes 82 (contact parts 82a) shown in FIG. 3 are discontinued. After flowing to Z2 through the belt-like p-contact region 61, the electron hole 83 enters the n-well region 4 from the p-contact region 56. The diagram shows only a one-way path (dashed line). Thereafter, the electron hole 83 flows toward Z1 through the n-well region 4. Because the electron hole 83 entering the n-well region 4 from the point Z2 flows through a long path along the belt-like p-contact region 56, the resistance thereof increases and the amount of electron holes 83 decreases significantly. Compared to the amount of electron holes 83 that enter the n-well region 4 from the p-contact region 56 that comes into contact with the second pickup electrodes 82, the amount of electron holes 83 entering the n-well region 4 from the p-contact region 56 that does not come into contact with the second pickup electrodes 82 is low.

As described above, in the opposition section E where the first and second pickup electrodes 81, 82 do not come into contact with the contact regions 56, 62, the amount of electrons 84 and the amount of electron holes 83 decrease. In other words, in the opposition section E, while the electron holes 83 and the electrons 84 flow along the belt-like contact regions 56, 62, the resistance (electric resistance) of the current path between the first and second pickup electrodes 81, 82 increases. This means that in the opposition section E of the high-voltage junction terminating region, whose distance W to the intermediate-potential region is short, the resistance of the current path between the first and second pickup electrodes 81, 82 is greater than those of the other sections.

By not disposing at least the first pickup electrodes 81 or the second pickup electrodes 82 (or by forming insulation films between the electrodes and the contact regions to insulate therebetween), the applied voltage of the negative-voltage surge in the n-well region becomes low compared to the other sections, and the amount of injected electron holes 83 and the amount of electrons 84 decrease, because the depletion layer stretches out in the belt-like n-contact region 62 or the belt-like p-contact region 56 at the opposition section E.

By not disposing the first pickup electrodes 81 or the second pickup electrodes 82 as described above, the amount of electrons 84 flowing toward the p-region 61 or the amount of electron holes 83 flowing toward the n-contact region 62 decreases in the opposition section E. Specifically, the amount of electron holes 83 or the amount of electrons 84 that neutralizes the abovementioned electrons 84 or electron holes 83 in accordance with a charge neutralization principle also decreases. In other words, by not disposing the first pickup electrodes 81 or the second pickup electrodes 82, the amount of electron holes 83 flowing to the n-well region 3 via the n-well region 4 and the amount of electrons 84 flowing to the p-region 61 decreases.

As a result, when the negative-voltage surge is input to the Vs terminal or the H-VDD terminal, an amount of the electron holes 83 flowing transiently to the n-well region 3, which is the high-potential region, can be suppressed. Thus, the high-voltage integrated circuit device (HVIC) capable of preventing an erroneous operation or destruction of the high-side circuit can be provided.

Meanwhile, the electrons 84 flowing transiently to the n-well region 2, which is the low-potential region, do not cause the low-side circuit to perform an erroneous operation.

Next, a method for forming each of the sections is described. In the n-well region 3 and the n-well region 4, the high-potential regions formed on the p-semiconductor substrate 1, phosphorous (P), for example, is ion-implanted at an impurity concentration of $1 \times 10^{13}/cm^2$ to $2 \times 10^{13}/cm^2$ and $1 \times 10^{12}/cm^2$ to $2 \times 10^{12}/cm^2$, and thereafter a diffusion step is carried out at a high temperature (approximately 1100° C. to 1200° C.) to diffuse the phosphorous up to a predetermined diffusion depth. As a result, the n-well region 3 and the n-well region 4 are formed.

Similarly, for the p-region 61, boron (B) is ion-implanted, and thereafter a diffusion step is performed at a high temperature (approximately 1100° C. to 1200° C.) to diffuse the boron up to a predetermined diffusion depth. Subsequently, arsenic, for example, is ion-implanted into the highly-concentrated n-contact region 62 to obtain a surface concentration of approximately $1\times10^{20}/cm^3$, so that the n-contact region 62 comes into ohmic contact with the H-VDD terminal, and thereafter an annealing step is carried out at approximately 750° C. to 900° C. As a result, the p-region 61 is formed at a predetermined depth.

Furthermore, boron fluoride ($BF_2$), for example, is ion-implanted into the highly-concentrated p-contact region 56 to obtain a surface concentration of approximately $1\times10^{20}/cm^3$, so that the p-contact region 56 comes into ohmic contact with the GND terminal. Thereafter, an annealing step is carried out at approximately 750° C. to 900° C. As a result, the p-contact region 56 is formed at a predetermined depth.

Subsequently, an interlayer insulation film is applied, and an opening part for providing a contact is formed on the interlayer insulation film, to form the first and second pickup electrodes 81, 82 and each of the electrodes or terminals on each of the regions. Thereafter, the surface of the p-semiconductor substrate 1 with the electrodes and terminals is coated with a protective film, not shown.

As shown in FIGS. 1 and 2, the pMOSFET 86 configured by the p-source region 33 and the p-drain region 34, the intermediate-potential region, and the n-contact region 62 are disposed on a surface layer of the n-well region 3, which is the high-potential region. The intermediate-potential region includes the p-offset region 31 and the p-drain region 34. The nMOSFET 85 configured by the n-source region 37 and the n-drain region 36 is disposed on a surface layer of the p-offset region 31. Turning the nMOSFET 85 on makes the p-drain region 34 become an intermediate-potential region. A C-MOS circuit configured by the pMOSFET 86 and the nMOSFET 85 is formed in the n-well region 3, obtaining a high-side logic part.

As described above, in the p-offset region 31, which is an intermediate-potential region, the resistance of the opposition section E can be made higher than those of the other sections by not disposing the first pickup electrodes 81 or the second pickup electrodes 82 on the n-contact region 62 and the p-contact region 56 (in other words, electrically insulating therebetween) on the opposition section E having the short distance W in the high-voltage junction terminating region.

As described above, when the negative-voltage surge is input, a large pulse current flows through the parasitic diode 46, and the pulse current can be prevented at the opposition section E when the resistance increases at the opposition section E of the high-voltage junction terminating region including the contact regions 62, 56.

The p-region 61 and the n-well region 4 are connected even in a section where neither the first pickup electrodes 81 nor the second pickup electrodes 82 are disposed (or when insulation films are formed and the contact parts 81a, 82 are not provided). Therefore, a small effect is produced on the breakdown voltage characteristics, and the same level of breakdown voltage characteristics as the section having the first pickup electrodes 81 and the second pickup electrodes 82 can be obtained.

Furthermore, the same effects can be obtained even when at least either the first pickup electrodes 81 or the second pickup electrodes 82 are eliminated. Eliminating the second pickup electrodes 82 is particularly effective.

Moreover, the same effects can be obtained even by electrically insulating the first and second pickup electrodes 81, 82 from the contact regions 62, 56 by providing interlayer insulation films or other insulation films between the first and second pickup electrodes 81, 82 and at least either one of the contact regions 62, 56 without eliminating the first and second pickup electrodes 81, 82.

Note that, as shown in FIG. 2, the amount of electron holes flowing to the Vs terminal can be made smaller in the present invention than in the technology described in Patent Literature 4, by connecting the cathode side of the parasitic diode 46 to the H-VDD terminal. As a result, the high-voltage integrated circuit device (HVIC) capable of preventing an erroneous operation or destruction of the high-side circuit can be provided.

(Second Embodiment 2)

Figure 5:
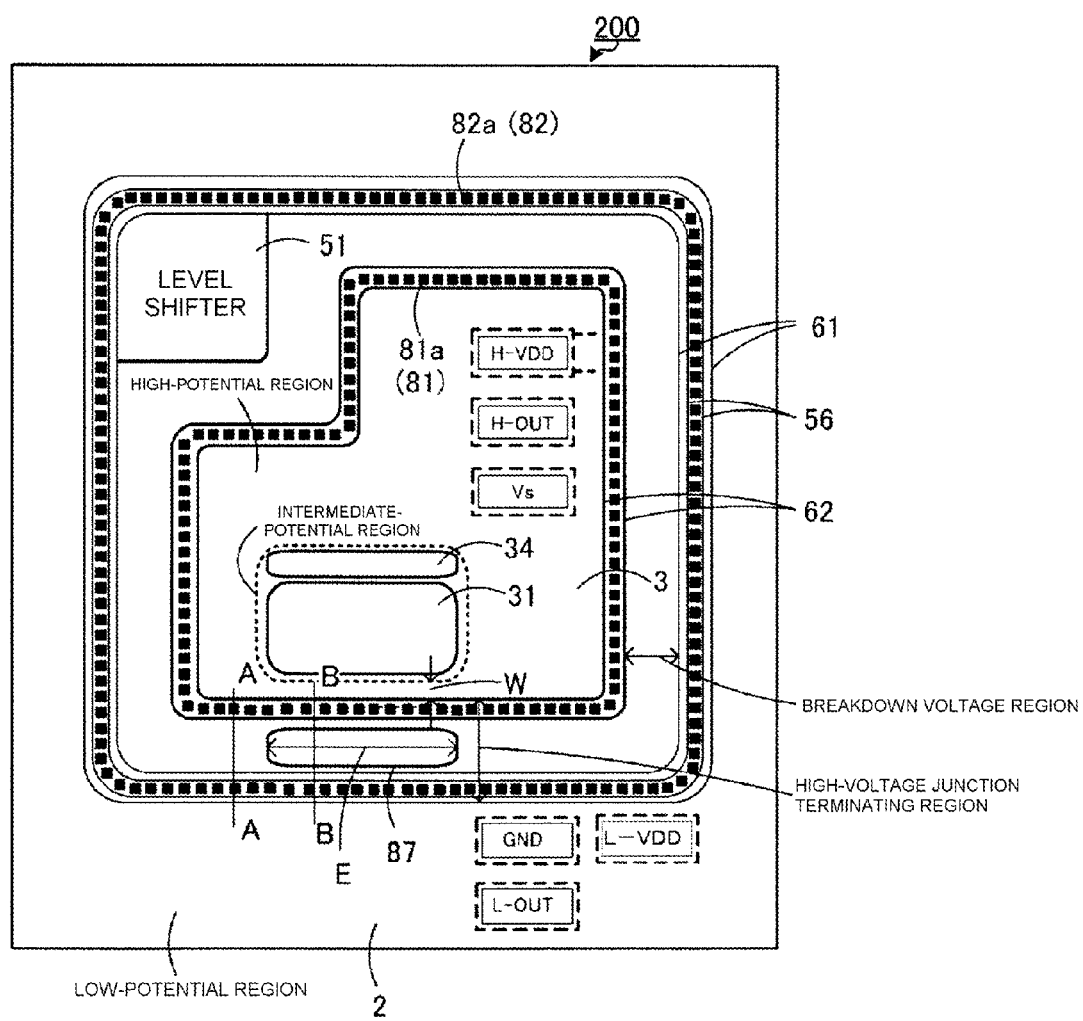
FIG. 5 is a plan view showing substantial parts of a high-voltage integrated circuit device according to Embodiment 2 of the present invention.
Figure 6:
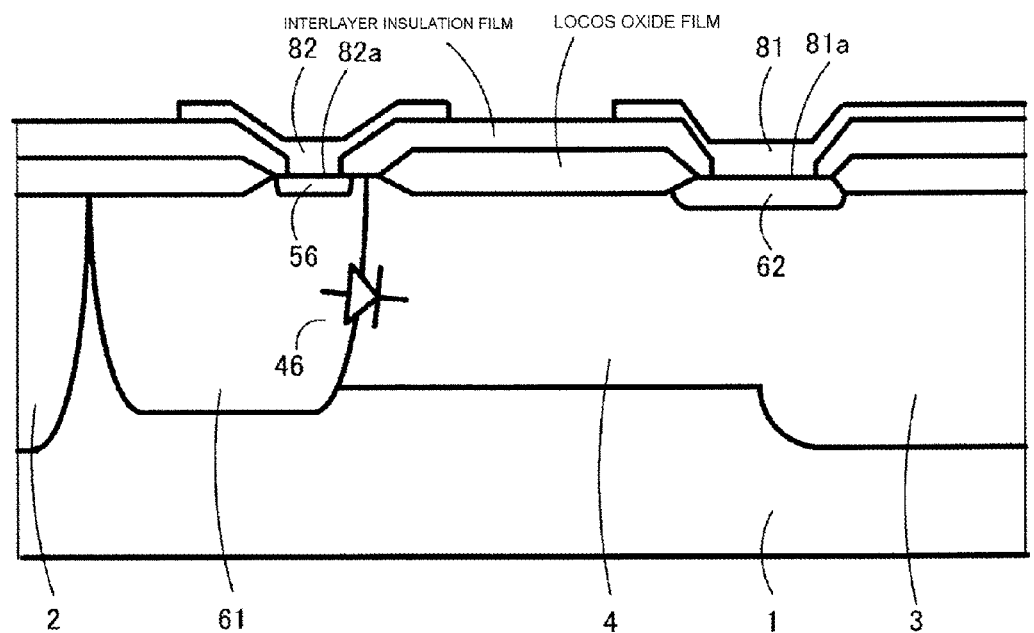
FIG. 6 is a cross-sectional diagram showing the substantial parts of the high-voltage integrated circuit device according to Embodiment 2 of the present invention.
Figure 6:
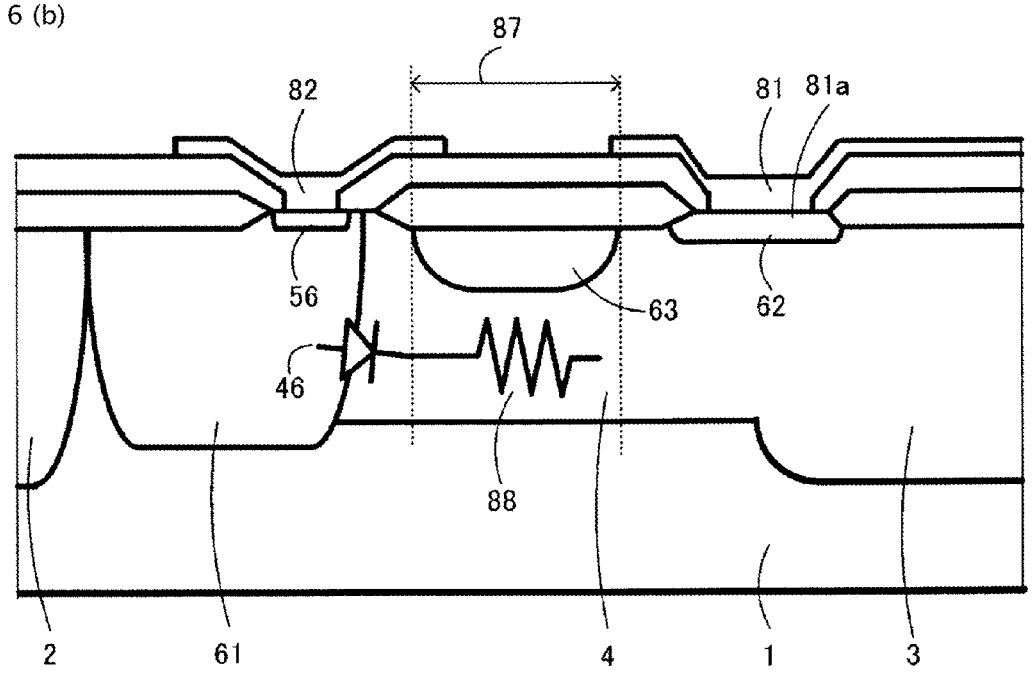

FIG. 5 is a plan view showing substantial parts of a high-voltage integrated circuit device 200 according to Embodiment 2 of the present invention. FIG. 6 is a cross-sectional diagram showing the substantial parts of the high-voltage integrated circuit device 200 according to Embodiment 2 of the present invention. FIG. 6(*a*) is a substantial cross-sectional diagram showing a cross-sectional structure taken along a section line A-A shown in FIG. 5. FIG. 6(*b*) is a substantial cross-sectional diagram showing a cross-sectional structure taken along a section line B-B shown in FIG. 5.

The difference between the high-voltage integrated circuit device 200 shown in FIG. 5 and the high-voltage integrated circuit device 100 shown in FIG. 1 is that the high-voltage integrated circuit device 200 has a double RESURF structure 87 formed in the opposition section E of the high-voltage junction terminating region, whose distance W to the intermediate-potential region is short, without removing the first pickup electrodes 81 or the second pickup electrodes 82 (or the contact parts 81a, 82a).

As shown in FIG. 6(*b*), the double RESURF structure is obtained by forming a p-top layer 63 on the surface layer of the n-well region 4 away from the p-region 61 and the n-contact region 62, the n-well region 4 being the high-voltage junction terminating region on the opposition section E whose distance to the intermediate-potential region is short. As a result, the n-well region is narrowed down in a vertical direction (in a depth direction of the p-semiconductor substrate 1) in the opposition section E. Consequently, the resistance of the current path between the first and second pickup electrodes 81, 82 can be increased. It should be noted that a single RESURF structure is formed in a section other than the opposition section E, so the n-well region 4 is not narrowed down therein in the vertical direction.

Increasing the resistance of the opposition section E increases a cathode resistance 88 of the parasitic diode 46 configured by the p-region 61 and the n-well region 4. As a result, the amount of electron holes injected in the opposition section E at the time of the input of the negative-voltage surge can be locally reduced.

The double RESURF structure 87 is a structure obtained by providing the surface of the n-well region 4 configuring the high-voltage junction terminating region, with the p-top layer 63 as an electric field relaxation region. Sandwiching the n-well region 4 between the p-semiconductor substrate 1 and the p-top layer 63 can promote depletion of the n-well region 4, relaxing an electric field of the opposition section E.

In this case, in the region of the double RESURF structure 87, the p-top layer 63 is formed on the surface layer of the n-well region 4, whereby n-type impurity concentration of the surface layer of the n-well region 4 decreases. Thus, when a high inverse voltage of approximately 600 V, for example, is applied between the p-region 61 on the GND potential side and the n-well region 3 on the H-VDD potential region side, the distribution of equipotential lines in the double RESURF region 87 fluctuates as compared to that of the single RESURF region in the other section.

However, the impurity concentrations of the p-top layer 63 and the n-well region 4 are adjusted to optimize the n-type impurity concentration of the surface of the substrate so that the opposition section E having the double RESURF structure 87 formed therein can have a surface electric field that is more relaxed than the section having the single RESURF structure formed therein. In this manner as well, the high-voltage integrated circuit device can be realized with little trouble with the breakdown voltage characteristics.

The high-resistance region (the cathode resistance 88) for preventing the electron hole injection upon the input of the negative-voltage surge can be formed by configuring the double RESURF structure 87 in which the p-top layer 63 is formed on the surface layer of the high-voltage junction terminating region (the n-well region 4) of the opposition section E, whose distance W to the Vs potential region is short.

As a result, when the negative-voltage surge is input to the Vs terminal or the H-VDD terminal, an amount of the electron holes flowing transiently to the n-well region 3, which is the high-potential region, can be suppressed. By suppressing the amount of the electron holes, it is possible to provide the high-voltage integrated circuit device (HVIC) that is capable of preventing an erroneous operation or destruction of the high-side circuit. The effects of the present invention can be further enhanced by adding the configurations illustrated in Embodiment 1 to the present configuration.

(Embodiment 3)

Figure 7:
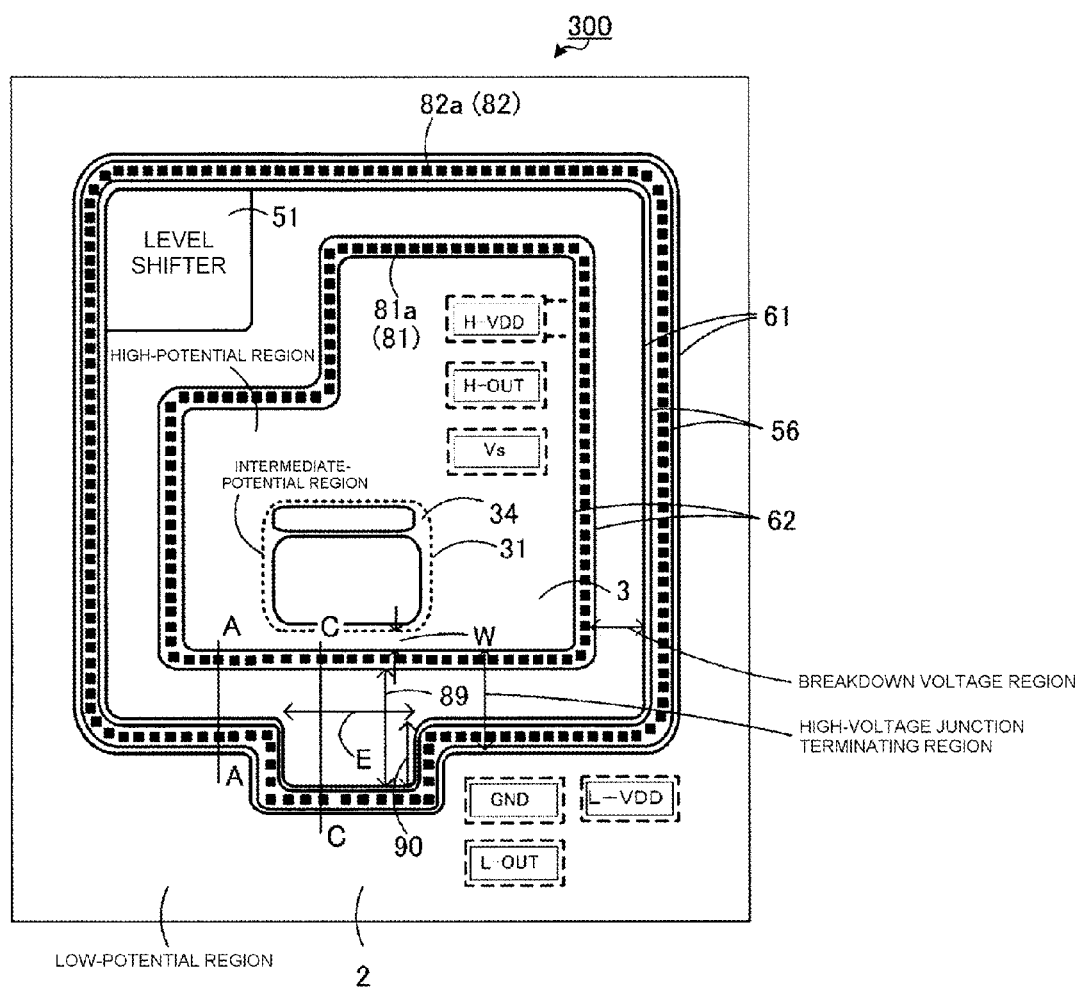
FIG. 7 is a plan view showing substantial parts of a high-voltage integrated circuit device according to Embodiment 3 of the present invention.
Figure 8:
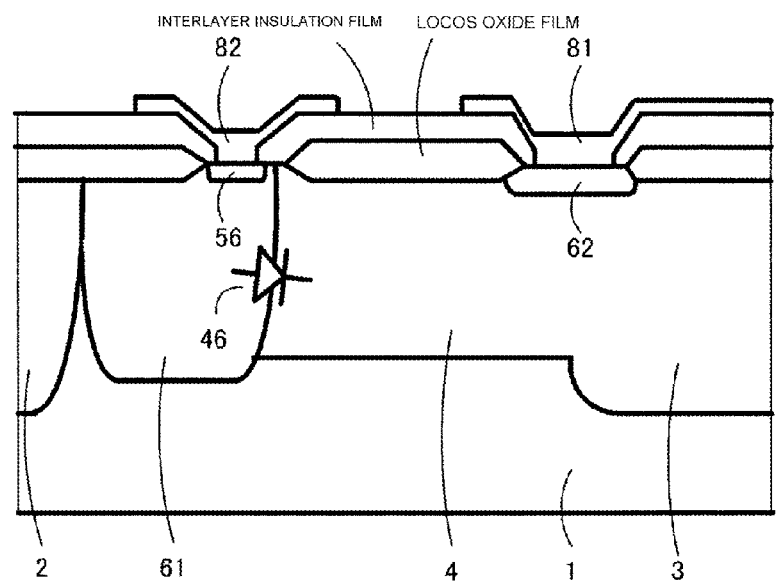
FIG. 8 is a cross-sectional diagram showing the substantial parts of the high-voltage integrated circuit device according to Embodiment 3 of the present invention.
Figure 8:
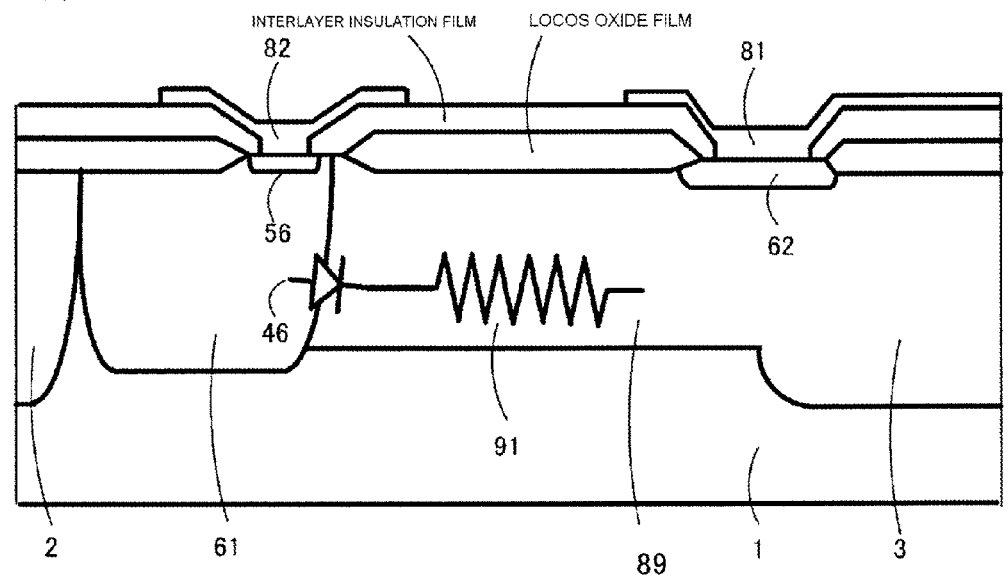
Figure 9:
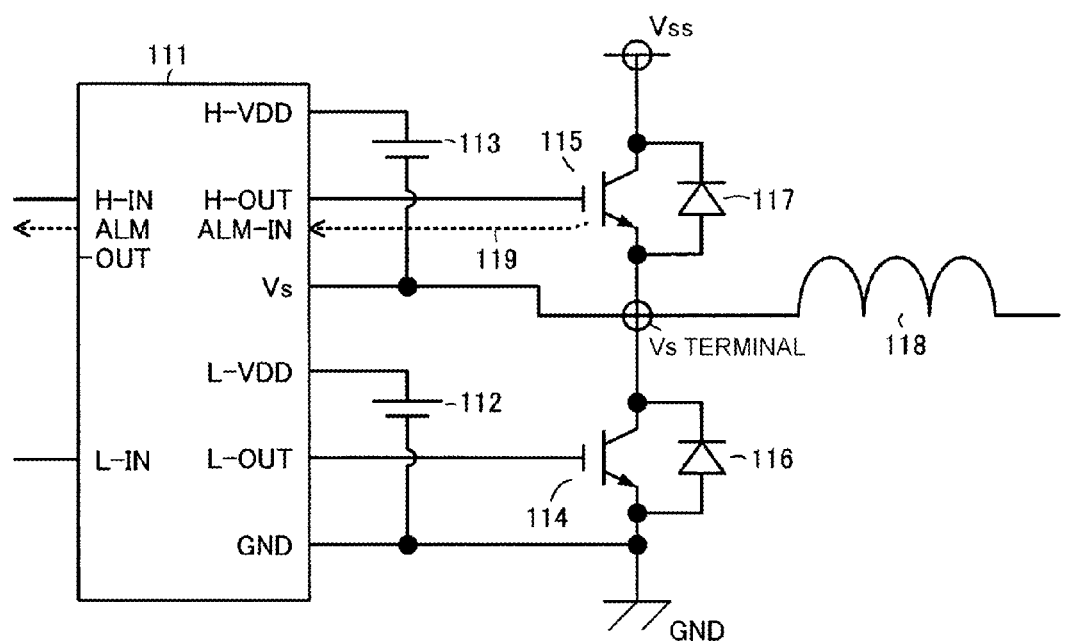
FIG. 9 is an explanatory diagram illustrating an example of connection between a switching power device of a power conversion device such as an inverter and a conventional HVIC that drives the switching power device.

FIG. 7 is a plan view showing substantial parts of a high-voltage integrated circuit device 300 according to Embodiment 3 of the present invention. FIG. 8 is a cross-sectional diagram showing the substantial parts of the high-voltage integrated circuit device 300 according to Embodiment 3 of the present invention. FIG. 8(*a*) is a substantial cross-sectional diagram showing a cross-sectional structure taken along a section line A-A shown in FIG. 7. FIG. 8(*b*) is a substantial cross-sectional diagram showing a cross-sectional structure taken along a section line C-C shown in FIG. 7.

The high-voltage integrated circuit device 300 shown in FIG. 7 is different from the high-voltage integrated circuit device 200 shown in FIG. 5 in that, in the opposition section E whose distance W to the Vs potential region is short, the n-well region 4, which the high-voltage junction terminating region, is made wide compared to the other sections, instead of forming the p-top layer 63 thereon. In this manner, in the opposition section E of the high-voltage junction terminating region, the resistance of the current path between the first and second pickup electrodes 81, 82 can be made greater than those of the other sections. Of the n-well region 4, an expansion 90 of the n-well region 89, which is obtained as a result of expanding the width of the n-well region 89 more than the other sections, may be a distance wide enough to satisfy the amount of negative-voltage surge that the HVIC needs to tolerate. Specifically, the n-type impurity concentration of the n-well region 4 is weaker than that of the n-well region 3 by one digit and therefore may be approximately several μm. Hence, the area of the chip does not increase.

Because the opposition section E has a high resistance, a cathode resistance 91 of the parasitic diode 46 configured by the p-region 61 and the n-well region 4 can be increased. As a result, the region that has less local injection of the electron holes upon the input of the negative-voltage surge can be formed within the breakdown voltage region.

As a result, when the negative-voltage surge is input to the Vs terminal or the H-VDD terminal, an amount of the electron holes flowing transiently to the n-well region 3 can be suppressed. By suppressing the amount of the electron holes, it is possible to provide the high-voltage integrated circuit device (HVIC) that is capable of preventing an erroneous operation or destruction of the high-side circuit. The effects of the present invention can be further enhanced by adding the configurations illustrated in Embodiment 1 to the present configuration.

Note that Embodiments 1 to 3 have described the situation where the p-offset region 31 configuring the intermediate-potential region is disposed adjacent to the high-voltage junction terminating region; however, the same results are obtained in a situation where the n-drain region 34 configuring the intermediate-potential region is disposed adjacent to the high-voltage junction terminating region. The configurations illustrated in Embodiments 1 to 3 can be combined with one another.

(Embodiment 4)

Figure 16:
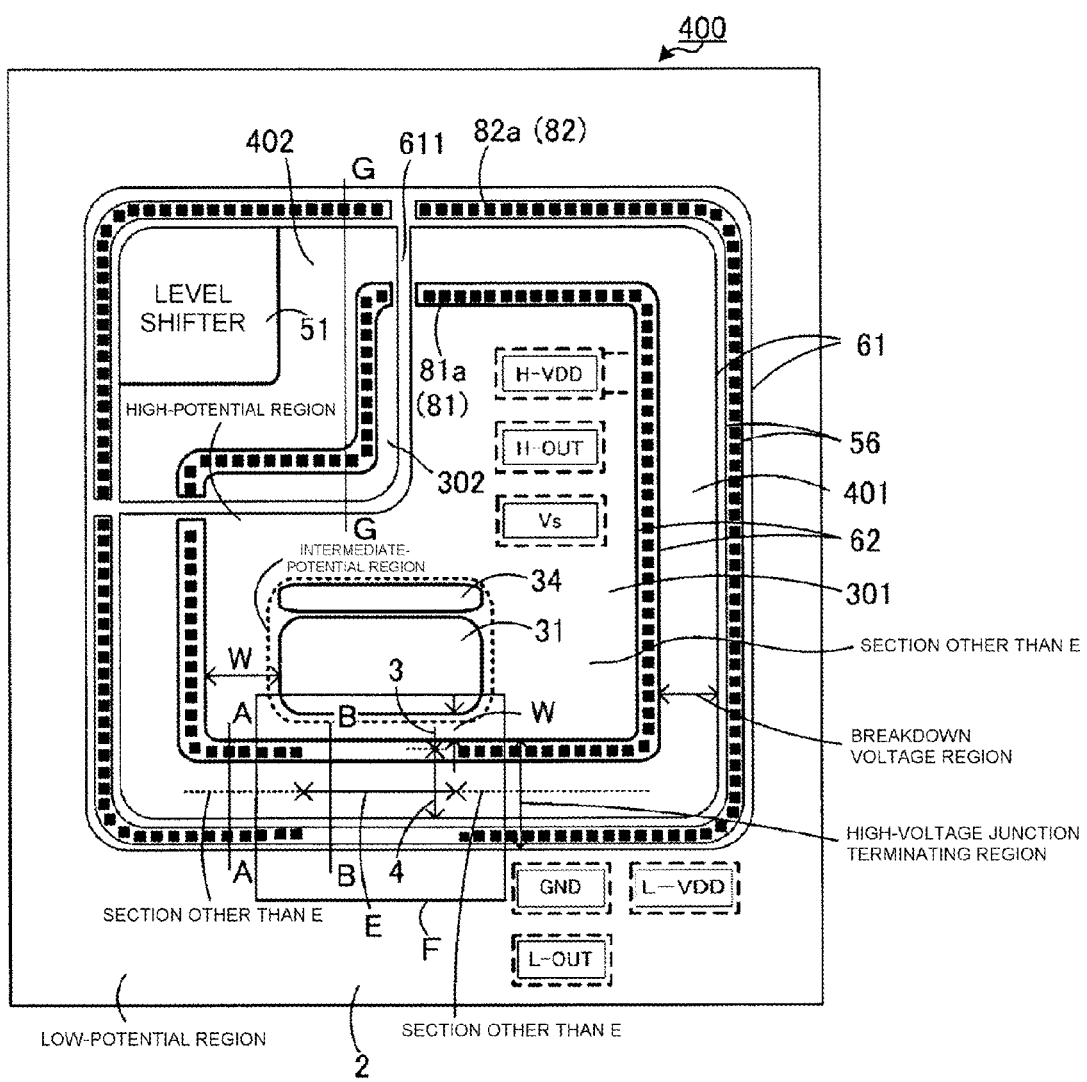
FIG. 16 is a plan view showing substantial parts of a high-voltage integrated circuit device according to Embodiment 4 of the present invention.
Figure 17:
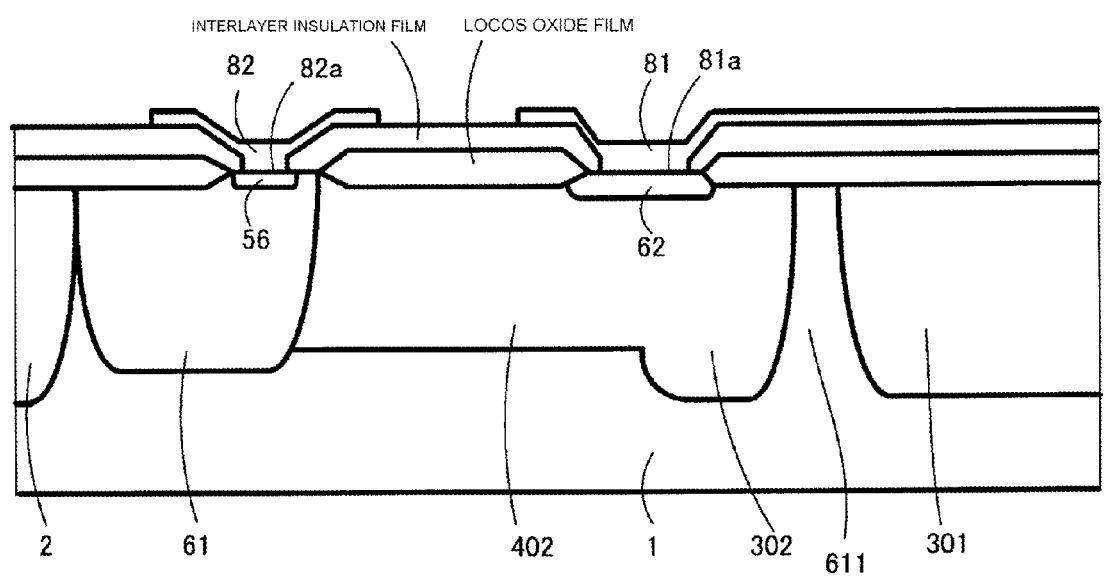
FIG. 17 is a cross-sectional diagram showing the substantial parts of the high-voltage integrated circuit device according to Embodiment 4 of the present invention.
Figure 17:
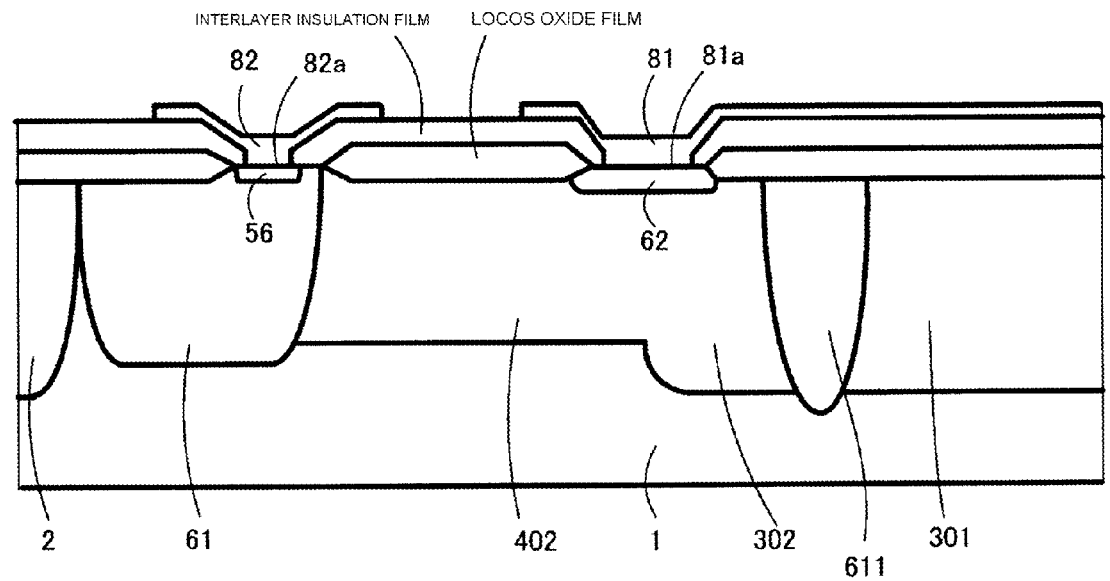

FIG. 16 is a plan view showing substantial parts of a high-voltage integrated circuit device 400 according to Embodiment 4 of the present invention. FIG. 17 is a cross-sectional diagram showing the substantial parts of the high-voltage integrated circuit device 400 according to Embodiment 4 of the present invention. FIG. 17(*a*) is a substantial cross-sectional diagram showing a cross-sectional structure taken along a section line G-G shown in FIG. 16. FIG. 17(*b*) is a substantial cross-sectional diagram showing another example of a cross-sectional structure taken along the section line G-G shown in FIG. 16, FIG. 17(*b*) being a modification.

The high-voltage integrated circuit device 400 shown in FIG. 16 is a modification of the high-voltage integrated circuit device 100 shown in FIG. 1. The high-voltage integrated circuit device 400 shown in FIG. 16 is different from that high-voltage integrated circuit device 100 shown in FIG. 1 in that the n-well region 3 is divided into an n-well region 301 and an n-well region 302 by a p-type separation region 611 and that the n-well region 4 is divided into an n-well region 401 and an n-well region 402 by the p-type separation region 611.

The p-type separation region 611 is configured between the n-well region 301 and the n-well region 302 by the p-semiconductor substrate 1 that is in contact with a LOCOS oxide film, as shown in FIG. 17(*a*), and is configured by a p-type diffusion region that reaches the p-semiconductor substrate 1 from the surface of the n-well region 3, as shown in FIG. 17(*b*). In such a configuration as well, the same effects as those described in Embodiment 1 can be obtained.

In addition, even in the configurations of the high-voltage integrated circuit device 200 of Embodiment 2 and the high-voltage integrated circuit device 300 of Embodiment 3, the p-type separation region 611 can be formed in the same manner as in the high-voltage integrated circuit device 400. Therefore, the effects of the present invention can be achieved.

INDUSTRIAL APPLICABILITY

As described above, the high-voltage integrated circuit device according to the present invention is useful in a high-voltage integrated circuit device that is used in transmitting an on/off drive signal to a gate of a switching power device of a PWM inverter, a switching power supply, and the like.

EXPLANATION OF REFERENCE NUMERALS

1 p-semiconductor substrate (ground potential region)
2 n-well region (low-potential region)
3 n-well region (high-potential region)

4 n-well region (high-voltage junction terminating region)
21 p-offset region (low-potential region)
31 p-offset region (intermediate-potential region)
46 parasitic diode
51 p-region (level shift formation region)
56 second contact region (p-contact region; ground potential region)
61 p-region (ground potential region)
62 first contact region (n-contact region; high-potential region)
81 first pickup electrode
81a contact part
82 second pickup electrode
82a contact part
83 electron hole
84 electron
85 nMOSFET
86 pMOSFET
87 double RESURF structure
100, 200, 300, 400 high-voltage integrated circuit device
Vs intermediate potential
H-VDD high-potential side of Vs terminal-based low-voltage power supply
GND ground (earth ground)
L-VDD high-potential side of GND-based low-voltage power supply

The invention claimed is:

1. A high-voltage integrated circuit device, which is a high-voltage semiconductor integrated circuit device that drives a high-potential-side power transistor out of two serially connected power transistors, the high-voltage semiconductor integrated circuit device comprising:
a high-potential region of second conductivity type that is formed on a surface layer of a semiconductor substrate of first conductivity type;
a breakdown voltage region of second conductivity type that is formed on the surface layer of the semiconductor substrate, in contact with the high-potential region and along an outer circumference of the high-potential region, and that has an impurity concentration lower than that of the high-potential region;
a ground potential region of first conductivity type that is formed on the surface layer of the semiconductor substrate, in contact with the breakdown voltage region and along an outer circumference of the breakdown voltage region, and that is applied with a ground potential;
a low-potential region of second conductivity type that is formed outside the ground potential region on the surface layer of the semiconductor substrate;
an intermediate-potential region of first conductivity type that is formed within the high-potential region so as to be joined to and separated from the high-potential region;
a first contact region of second conductivity type that is formed along an end part of the breakdown voltage region that is on the high-potential region side;
a second contact region of first conductivity type that is formed on a surface layer of the ground potential region so as to face the first contact region;
a first pickup electrode that is in contact with the first contact region; and
a second pickup electrode that is in contact with the second contact region,
wherein the intermediate-potential region is a region to which is applied an intermediate potential between a high-potential-side potential and a ground potential of a high-voltage power supply, which is a main circuit power supply of the two serially connected power transistors,
the low-potential region is a region to which is applied a high-potential-side potential of a first low-voltage power supply based on the ground potential,
the high-potential region is a region to which is applied a high-potential-side potential of a second low-voltage power supply based on the intermediate potential,
a high-voltage junction terminating region, which is configured by the breakdown voltage region, the ground potential region, the first contact region and the second contact region, is formed, and
in a section of the high-voltage junction terminating region, whose distance to the intermediate-potential region is shorter than those of other sections, a resistance of a current path between the first pickup electrode and the second pickup electrode is higher than those of the other sections.

2. A high-voltage integrated circuit device, which is a high-voltage semiconductor integrated circuit device that drives a high-potential-side power transistor out of two serially connected power transistors, the high-voltage semiconductor integrated circuit device comprising:
a high-potential region of second conductivity type that is formed on a surface layer of a semiconductor substrate of first conductivity type;
a separation region of first conductivity type that splits a part of an outer circumference of the high-potential region;
a breakdown voltage region of second conductivity type that is formed on the surface layer of the semiconductor substrate, in contact with the high-potential region and along the outer circumference of the high-potential region, and that has an impurity concentration lower than that of the high-potential region;
a ground potential region of first conductivity type that is formed on the surface layer of the semiconductor substrate, in contact with the separation region and along an outer circumference of the breakdown voltage region, and that is applied with a ground potential;
a low-potential region of second conductivity type that is formed outside the ground potential region on the surface layer of the semiconductor substrate;
an intermediate-potential region of first conductivity type that is formed within the high-potential region so as to be joined to and separated from the high-potential region;
a first contact region that is formed along an end part of the breakdown voltage region that is on the high-potential region side;
a second contact region that is formed on a surface layer of the ground potential region;
a first pickup electrode that is in contact with the first contact region; and
a second pickup electrode that is in contact with the second contact region,
wherein the intermediate-potential region is a region to which is applied an intermediate potential between a high-potential-side potential and a ground potential of a high-voltage power supply, which is a main circuit power supply of the two serially connected power transistors,
the low-potential region is a region to which is applied a high-potential-side potential of a first low-voltage power supply based on the ground potential, the high-potential region is a region to which is applied a high-potential-side potential of a second low-voltage power supply based on the intermediate potential, a high-voltage junction terminating region, which is configured by the breakdown voltage region, the ground potential region, the first contact region and the second contact region, is formed, and in a section of the high-voltage junction terminating region, whose distance to the intermediate-potential region is shorter than those of other sections, a resistance of a current path between the first pickup electrode and the second pickup electrode is higher than those of the other sections.

3. The high-voltage integrated circuit device according to claim 1, wherein the resistance is made higher than those of the other sections by forming the first pickup electrode, except for the section of the high-voltage junction terminating region, whose distance to the intermediate-potential region is shorter than those of the other sections.

4. The high-voltage integrated circuit device according to claim 1, wherein the resistance is made higher than those of the other sections by forming the second pickup electrode, except for the section of the high-voltage junction terminating region, whose distance to the intermediate-potential region is shorter than those of the other sections.

5. The high-voltage integrated circuit device according to claim 1, wherein the resistance is made higher than those of the other sections by electrically insulating at least between the first contact region and the first pickup electrode or between the second contact region and the second pickup electrode, in the section of the high-voltage junction terminating region, whose distance to the intermediate-potential region is shorter than those of the other sections.

6. The high-voltage integrated circuit device according to claim 1, wherein the resistance is made higher than those of the other sections by configuring a double RESURF structure by forming a semiconductor region of the same conductivity type as the ground potential region on a surface layer of the high-voltage junction terminating region and away from the high-potential region and the ground potential region, in the section of the high-voltage junction terminating region, whose distance to the intermediate-potential region is shorter than those of the other sections.

7. The high-voltage integrated circuit device according to claim 1, wherein the resistance is made higher than those of the other sections by stretching the breakdown voltage region toward the low-potential region, in the section of the high-voltage junction terminating region, whose distance to the intermediate-potential region is shorter than those of the other sections.

8. The high-voltage integrated circuit device according to claim 2, wherein the resistance is made higher than those of the other sections by forming the first pickup electrode, except for the section of the high-voltage junction terminating region, whose distance to the intermediate-potential region is shorter than those of the other sections.

9. The high-voltage integrated circuit device according to claim 2, wherein the resistance is made higher than those of the other sections by forming the second pickup electrode, except for the section of the high-voltage junction terminating region, whose distance to the intermediate-potential region is shorter than those of the other sections.

10. The high-voltage integrated circuit device according to claim 2, wherein the resistance is made higher than those of the other sections by electrically insulating at least between the first contact region and the first pickup electrode or between the second contact region and the second pickup electrode, in the section of the high-voltage junction terminating region, whose distance to the intermediate-potential region is shorter than those of the other sections.

11. The high-voltage integrated circuit device according to claim 2, wherein the resistance is made higher than those of the other sections by configuring a double RESURF structure by forming a semiconductor region of the same conductivity type as the ground potential region on a surface layer of the high-voltage junction terminating region and away from the high-potential region and the ground potential region, in the section of the high-voltage junction terminating region, whose distance to the intermediate-potential region is shorter than those of the other sections.

12. The high-voltage integrated circuit device according to claim 2, wherein the resistance is made higher than those of the other sections by stretching the breakdown voltage region toward the low-potential region, in the section of the high-voltage junction terminating region, whose distance to the intermediate-potential region is shorter than those of the other sections.

* * * * *